United States Patent
Kawamura

(10) Patent No.: US 9,575,110 B2
(45) Date of Patent: Feb. 21, 2017

(54) INSULATION DETECTING DEVICE AND INSULATION DETECTING METHOD OF NON-GROUNDED POWER SUPPLY

(71) Applicant: Yazaki Corporation, Tokyo (JP)

(72) Inventor: Yoshihiro Kawamura, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 167 days.

(21) Appl. No.: 14/680,122

(22) Filed: Apr. 7, 2015

(65) Prior Publication Data

US 2015/0293167 A1 Oct. 15, 2015

(30) Foreign Application Priority Data

Apr. 9, 2014 (JP) ................................. 2014-079945
Jan. 16, 2015 (JP) ................................. 2015-006332

(51) Int. Cl.
G01R 31/02 (2006.01)
G01N 27/82 (2006.01)
(Continued)

(52) U.S. Cl.
CPC ............. *G01R 31/14* (2013.01); *B60L 3/0069* (2013.01); *G01R 31/006* (2013.01); *G01R 31/025* (2013.01)

(58) Field of Classification Search
CPC ..... G01R 31/025; G01R 33/07; G01R 15/202; G01R 31/08; G01R 31/1272; G01R 19/165; G01R 31/02; G01R 31/024; G01R 31/14; G01R 33/075; G01R 31/00; G01R 31/005; G01R 31/006; G01R 31/021; G01R 31/022; G01R 31/026; G01R 31/083; G01R 31/12; G01R 31/2805; G01R 31/2812; G01R 27/02; G01R 27/2605; G01R 1/07328; H01L 27/22; H01L 2924/0002; H01L 2924/00; H01L 43/04; H01L 43/10; H01L 43/14; H01L 23/34; G01N 27/82; G01N 27/90; B60L 3/04; B60L 2240/547; B60L 2270/147; H01B 7/328; H04B 3/46
(Continued)

(56) References Cited

U.S. PATENT DOCUMENTS 7,075,311 B1 * 7/2006 Oshiro ............... G01R 31/1272
324/557
8,106,667 B2 * 1/2012 Kawamura .......... G01R 27/025
324/551
(Continued)

FOREIGN PATENT DOCUMENTS

JP 2011-17586 A 1/2011

*Primary Examiner* — Patrick Assouad
*Assistant Examiner* — Taqi Nasir
(74) *Attorney, Agent, or Firm* — Sughrue Mion, PLLC

(57) ABSTRACT

An insulation detecting device includes a control unit configured to monitor a measurement voltage of a flying capacitor charged through a second path, and in a case where a measurement voltage is about 0 V (zero volt), control a switching of switches, control a charging of the flying capacitor through a third path and a measuring of a charged voltage of the flying capacitor charged through the third path, and measure a first measurement voltage in a first time after the switching to the third path and a second measurement voltage in a second time different from the first time, and a calculating unit configured to calculate a ground fault resistance formed between a direct-current power supply and a ground based on the first measurement voltage and the second measurement voltage.

7 Claims, 15 Drawing Sheets

(51) Int. Cl.
*G01R 31/14* (2006.01)
*B60L 3/00* (2006.01)
*G01R 31/00* (2006.01)

(58) Field of Classification Search
USPC ....... 324/537, 510, 541, 544, 551, 555, 557, 324/509, 500, 251, 539, 543, 763.01
See application file for complete search history.

(56) References Cited

U.S. PATENT DOCUMENTS

| | | | |
|---|---|---|---|
| 8,335,062 B2* | 12/2012 | Haines | H02H 3/00 |
| | | | 320/109 |
| 8,405,939 B2* | 3/2013 | Haines | H02H 9/00 |
| | | | 361/42 |
| 8,493,073 B2* | 7/2013 | Yamamoto | G01R 35/00 |
| | | | 324/541 |
| 2007/0001684 A1* | 1/2007 | Kawamura | G01R 19/2503 |
| | | | 324/522 |
| 2007/0210805 A1* | 9/2007 | Kawamura | G01R 31/44 |
| | | | 324/541 |
| 2011/0006781 A1* | 1/2011 | Kawamura | G01R 31/025 |
| | | | 324/551 |

* cited by examiner

FIG.4A

| 20 | 21 | 22 | 23 | 24 | 25 | 26 | 27 |
|---|---|---|---|---|---|---|---|
| V0 MEASUREMENT | MEASURE-MENT/DIS-CHARGE | Vc1n MEASUREMENT | MEASURE-MENT/DIS-CHARGE | V0 MEASUREMENT | MEASURE-MENT/DIS-CHARGE | Vc1p MEASUREMENT | MEASURE-MENT/DIS-CHARGE |

FIG.4B

| 20 | 21 | 22 | 23 | 24 | 25 | 28 | 29 | 30 |
|---|---|---|---|---|---|---|---|---|
| V0 MEASUREMENT | MEASURE-MENT/DIS-CHARGE | Vc1n MEASUREMENT | MEASURE-MENT/DIS-CHARGE | V0 MEASUREMENT | MEASURE-MENT/DIS-CHARGE | Vc1pta MEASURE-MENT | Vc1ptb MEASUREMENT | MEASURE-MENT/DIS-CHARGE |

FIG.11

| 20 | 21 | 22 | 23 | 37 | 38 | 39 | 40 |
|---|---|---|---|---|---|---|---|
| V0 MEASUREMENT | MEASURE-MENT/DIS-CHARGE | Vc1n MEASUREMENT | MEASURE-MENT/DIS-CHARGE | Vc1pta-MEASURE-MENT | MEASURE-MENT/DIS-CHARGE | Vc1ptb MEASUREMENT (Vc1p MEASURE-MENT) | MEASURE-MENT/DIS-CHARGE |

FIG.15

(a) TABLE 1

| Vtb/Vta | GROUND FAULT RESISTANCE [kΩ] |
|---|---|
| 5 | 800 |
| 10 | 400 |
| 15 | 200 |
| 20 | 100 |

(b) TABLE 2

(Vtb/Vta=10)

| Vtb | B-C VOLTAGE [V] |
|---|---|
| 80 | 400 |
| 90 | 500 |
| 100 | 600 |

(Vtb/Vta=15)

| Vtb | B-C VOLTAGE [V] |
|---|---|
|  |  |
|  |  |
|  |  |

INSULATION DETECTING DEVICE AND INSULATION DETECTING METHOD OF NON-GROUNDED POWER SUPPLY

CROSS-REFERENCE TO RELATED APPLICATIONS

The present application claims priority to and incorporates by reference the entire contents of Japanese Patent Application No. 2014-079945 filed in Japan on Apr. 9, 2014 and Japanese Patent Application No. 2015-006332 filed in Japan on Jan. 16, 2015.

BACKGROUND OF THE INVENTION

1. Field of the Invention

The present invention relates to an insulation detecting device and an insulation detecting method of a non-grounded power source, and particularly to an insulation detecting device and an insulation detecting method which detects an insulation status between a voltage boosting circuit and a non-grounded direct-current power supply mounted in an electric propulsion vehicle.

2. Description of the Related Art

In recent years, an electric automobile and a hybrid car are mounted with a battery assembly (hereinafter, abbreviated as a "direct-current power supply") as a compact direct-current power supply having a high electric power and a high output power, and an output voltage thereof is equal to or more than 200 V (volt). In addition, in order to increase efficiency in driving loads, there is provided a vehicle provided with a voltage boosting circuit to boost and supply a positive potential of the direct-current power supply to the loads. In the vehicle provided with the voltage boosting circuit, the output of the direct-current power supply (that is, a primary side of the voltage boosting circuit) and the output of the voltage boosting circuit (that is, a secondary side) both are electrically insulated from the vehicle in a non-grounded manner. The vehicle is not used as the ground of the direct-current power supply and the voltage boosting circuit. Therefore, in the vehicle having the voltage boosting circuit, a ground fault resistance between the direct-current power supply and the ground and a ground fault resistance between the secondary side of the voltage boosting circuit and the ground both are necessarily detected in order to monitor an insulation status of the direct-current power supply.

As an insulation detecting device which detects the ground fault resistance between the direct-current power supply and the ground and the ground fault resistance between the secondary side of the voltage boosting circuit and the ground, for example, there is an insulation status detecting device disclosed in Japanese Patent Application Laid-open No. 2011-17586. The insulation status detecting device disclosed in Japanese Patent Application Laid-open No. 2011-17586 is configured to measure a composited ground fault resistance formed by the ground fault resistance between the direct-current power supply and a ground potential and the ground fault resistance between the secondary side of the voltage boosting circuit and the ground.

In the insulation status detecting device disclosed in Japanese Laid-open Patent Publication No. 2011-17586, the ground fault resistance formed between the positive electrode on the secondary side of the voltage boosting circuit and the ground (a secondary side+ground fault resistance) and the ground fault resistance formed between the negative electrode of the direct-current power supply (corresponding to the negative electrode of on the secondary side of the voltage boosting circuit) and the ground (a secondary side−ground fault resistance) are connected in series between the positive electrode and the negative electrode on the secondary side the voltage boosting circuit through the ground. In addition, in a case where a potential according to a division of the secondary side+ground fault resistance and the secondary side−ground fault resistance is higher than the positive electrode potential of the direct-current power supply, a sneak current from the secondary side "+" ground fault resistance of the voltage boosting circuit to the positive electrode of the direct-current power supply through a flying capacitor is generated. Furthermore, there is provided a reversed polarity measurement circuit which connects the flying capacitor to be in the reversed polarity with respect to a measurement means and the ground in order to measure a charged voltage in the reversed polarity with respect to the flying capacitor due to the sneak current.

Therefore, there is provided a measurement means which measure the charged voltage at the time of a positive polarity in a case where the flying capacitor is charged through the positive electrode of the direct-current power supply, and a measurement means which measures the charged voltage at the time of a reversed polarity in a case where the flying capacitor is charged through the positive electrode on the secondary side of the voltage boosting circuit at the time of the reversed polarity. In other words, there is required a dual-system measurement means including a measurement means which measures a charged voltage charged without the sneak current and a measurement unit which measures a charged voltage of the reversed polarity charged by the sneak current. Furthermore, the reversed polarity measurement circuit including at least a diode, a resistor, and a switch is necessarily added, and ON/OFF control on the added switch and a switching operation of the measurement means corresponding to the ON/OFF control are also necessary. Therefore, there is a problem in that a circuit scale is increased and a load on control software is also increased.

SUMMARY OF THE INVENTION

The present invention is made in view of these circumstances, and an object of the present invention is to provide an insulation detecting device and an insulation detecting method which can measure a ground fault resistance between the direct-current power supply and the voltage boosting circuit, and the ground using a simple configuration not requiring an additional circuit.

According to one aspect of the present invention, an insulation detecting device which includes a flying capacitor configured to retain a charged voltage and a measurement circuit configured to measure the charged voltage of the flying capacitor, is connected to a direct-current power supply electrically insulated from a ground, and measures a ground fault resistance formed between the direct-current power supply and the ground based on the charged voltage of the flying capacitor which is measured by the measurement circuit, the insulation detecting device includes: a plurality of switches configured to switch a first path from a positive electrode of the direct-current power supply to an negative electrode of the direct-current power supply through the flying capacitor, a second path from the positive electrode of the direct-current power supply to the ground through the flying capacitor, a third path from the ground to the negative electrode of the direct-current power supply through the flying capacitor, and a fourth path which releases a connection between the flying capacitor and the direct-current power supply and connects the flying capacitor and the measurement circuit; a control means configured to monitor a measurement voltage of the flying capacitor charged through the second path, and in a case where the measurement voltage is about 0 V (zero volt), control a switching of the switches, control a charging of the flying capacitor through the third path and a measuring of the charged voltage of the flying capacitor charged through the third path, and measure a first measurement voltage in a first time after the switching to the third path and a second measurement voltage in a second time different from the first time; and a calculating means configured to calculate the ground fault resistance formed between the direct-current power supply and the ground based on the first measurement voltage and the second measurement voltage.

According to another aspect of the present invention, an insulation detecting device which includes a flying capacitor configured to retain a charged voltage and a measurement circuit configured to measure the charged voltage of the flying capacitor, is connected to a direct-current power supply electrically insulated from a ground and to a voltage boosting circuit on a side of the direct-current power supply, and measure a ground fault resistance formed between the direct-current power supply and a secondary side of the voltage boosting circuit, and the ground, the voltage boosting circuit being configured to boost an output voltage of the direct-current power supply and electrically insulated from the ground, the insulation detecting device includes: a plurality of switches configured to switch a first path from a positive electrode of the direct-current power supply to an negative electrode of the direct-current power supply through the flying capacitor, a second path from the positive electrode of the direct-current power supply to the ground through the flying capacitor, a third path from the ground to the negative electrode of the direct-current power supply through the flying capacitor, and a fourth path which releases a connection between the flying capacitor and the direct-current power supply and connects the flying capacitor and the measurement circuit; a control means configured to, in a case where an output voltage on the secondary side is boosted by a boosting operation of the voltage boosting circuit and the ground potential becomes higher than a potential on the positive electrode side of the direct-current power supply, control a switching of the switches, control a charging of the flying capacitor through the third path and a measuring of the charged voltage of the flying capacitor charged through the third path, and measure a first measurement voltage in a first time after the switching to the third path and a second measurement voltage in a second time different from the first time; and a calculating means configured to calculate the ground fault resistance formed between the direct-current power supply and the secondary side of the voltage boosting circuit, and the ground based on the first measurement voltage and the second measurement voltage.

According to still another aspect of the present invention, an insulation detecting method of measuring a ground fault resistance which is formed between a direct-current power supply electrically insulated from a ground and the ground, the insulation detecting method includes the steps of: connecting a flying capacitor between a positive electrode of the direct-current power supply and the ground to charge the flying capacitor; connecting a measurement circuit to the flying capacitor after the positive electrode of the direct-current power supply is disconnected from the flying capacitor, and measuring a voltage charged in the flying capacitor; monitoring the measured voltage, and in a case where the measured voltage is about 0 V (zero volt), charging the flying capacitor by connecting the flying capacitor between the ground and an negative electrode of the direct-current power supply, and measuring a first measurement voltage in a first time after the connection of the flying capacitor and a second measurement voltage in a second time different from the first time; and calculating the ground fault resistance formed between the direct-current power supply and the ground based on the first measurement voltage and the second measurement voltage.

According to still another aspect of the present invention, in the insulation detecting device, the plurality of switches includes a first switch which is disposed between one end of the flying capacitor and the positive electrode of the direct-current power supply, a second switch which is disposed between the other end of the flying capacitor and the negative electrode of the direct-current power supply, a third switch which is disposed between one end of the flying capacitor and the ground, and a fourth switch which is disposed between the other end of the flying capacitor and the ground, and the second switch and the fourth switch are connected to each other in parallel, and each of the second switch and the fourth switch includes a protection element configured to maintain a voltage applied to the second switch and the fourth switch to be equal to or lower than a withstanding voltage thereof.

According to still another aspect of the present invention, in the insulation detecting device, the control means includes an estimating means configured to estimate a voltage applied between the negative electrode side of the direct-current power supply of the second switch and the ground side of the fourth switch in the first path, based on the first and second measurement voltages and a characteristic of the protection element connected in parallel with at least the fourth switch, and a correcting means configured to correct an output voltage of the direct-current power supply calculated from a measurement voltage of the flying capacitor charged through the first path, based on a voltage applied between the negative electrode side of the direct-current power supply of the second switch and the ground side of the fourth switch and a characteristic of the protection element connected in parallel with the fourth switch.

The above and other objects, features, advantages and technical and industrial significance of this present invention will be better understood by reading the following detailed description of presently preferred embodiments of the present invention, when considered in connection with the accompanying drawings.

BRIEF DESCRIPTION OF THE DRAWINGS

FIGS. 4A and 4B are diagrams for describing the measuring operation in the insulation detecting device of the first embodiment of the present invention;

FIG. 11 is a diagram for describing a measuring operation in an insulation detecting device of a third embodiment of the present invention;

FIG. 15 is a diagram illustrating an example of table data for correcting a measurement value at the time of the V0 measurement in the insulation detecting device of the fourth embodiment of the present invention.

DETAILED DESCRIPTION OF THE PREFERRED EMBODIMENTS

Hereinafter, embodiments to which the present invention is applied will be described using the drawings. However, in the following description, the same components will be denoted with the same symbols, and the description thereof will not be repeated.

First Embodiment

Overall Configuration of Insulation Detecting Device

Figure 1:
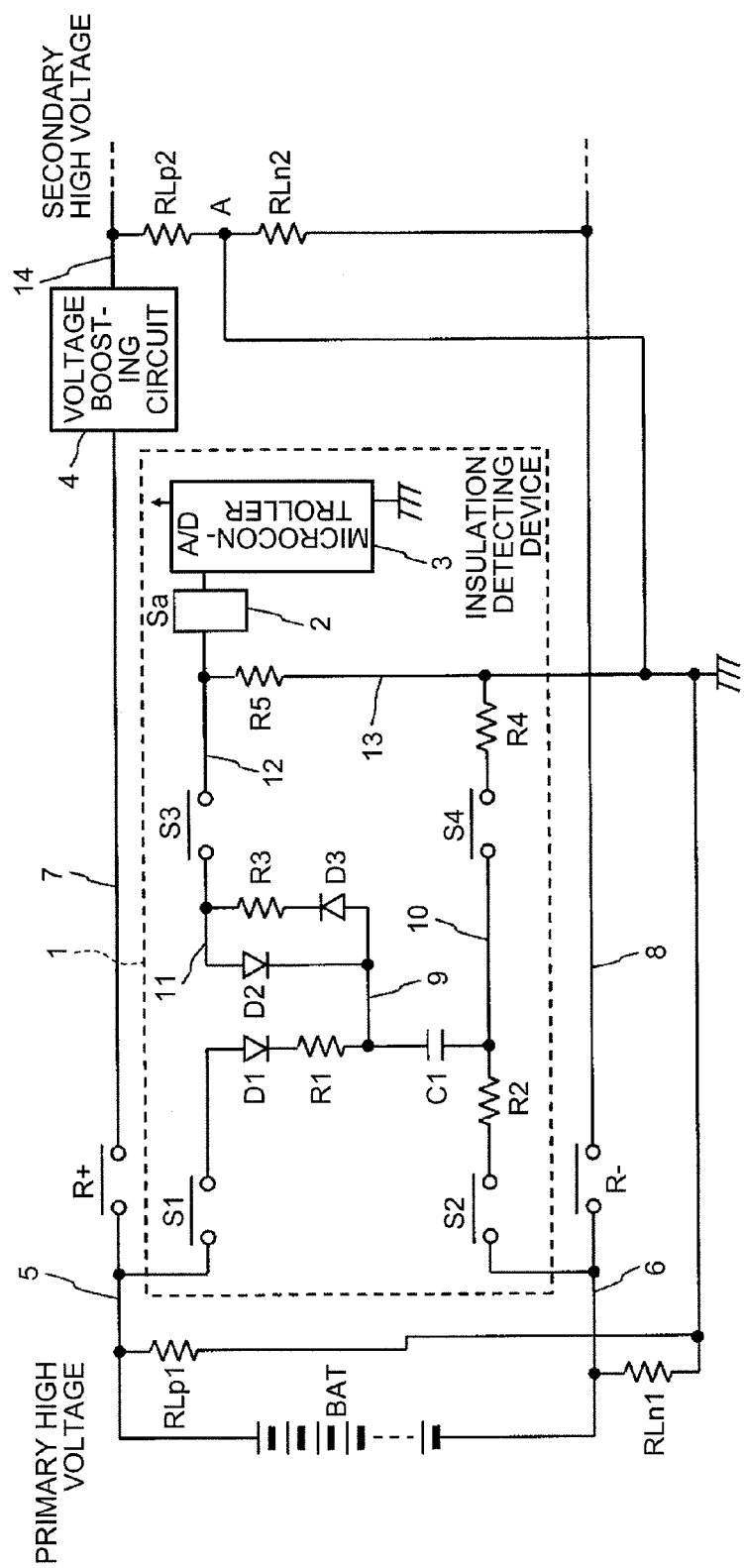
FIG. 1 is a diagram for describing a schematic configuration of an insulation detecting device of a first embodiment of the present invention.

FIG. 1 is a diagram for describing a schematic configuration of an insulation detecting device of a first embodiment of the present invention, and particularly to a circuit in which an insulation detecting device 1 is disposed on the primary side of a voltage boosting circuit 4 to boost a voltage on the positive electrode side of a direct-current power supply BAT. However, the insulation detecting device 1 of the first embodiment is configured equal to the insulation detecting device in the related art except a ground fault resistance measuring unit (not illustrated) which is realized by a program executed by a microcomputer 3. In addition, switches S1 to S4, for example, are configured by optical MOSFETs, and controlled to be turned on/off by the microcomputer 3 insulated from the direct-current power supply BAT. The insulation detecting device 1 is configured to be connected to a node on a side near the direct-current power supply BAT from main relays R+ and R−.

As illustrated in FIG. 1, for example, a power line 5 connected to the positive electrode of the direct-current power supply BAT of a high voltage of 200 V (volt) or more is branched. One branched power line 5 is connected to one end of the switch S1 included in the insulation detecting device 1, and the other one is connected to the main relay R+.

On the other hand, a power line 6 connected to the negative electrode of the direct-current power supply BAT is also branched. One branched power line 6 is connected to one end of the switch S2 included in the insulation detecting device 1, and the other one is connected to the main relay R−.

In addition, the other end of the switch S1 is electrically connected to one end (the upper terminal in the drawing) of a capacitor (a flying capacitor) 01 through a diode D1, a resistor R1 connected in series the diode D1, and a wiring (a branch wiring) 9 which is branched and electrically connected to the resistor R1. Furthermore, the other end of the switch S2 is electrically connected to the other end of the capacitor C1 (the lower terminal in the drawing) through a resistor R2 and a branch wiring 10. With this configuration, by the ON/OFF control (switching control) of two switches S1 and S2, the electrical connection between the positive electrode of the direct-current power supply BAT and the one end of the capacitor C1, and the electrical connection between the negative electrode of the direct-current power supply BAT and the other end of the capacitor C1 can be controlled independently of each other. However, the diode D1 is disposed in a direction from the positive electrode of the direct-current power supply BAT toward the capacitor C1 as its forward direction.

The one end of the capacitor C1 is connected to one end of the switch S3 through a diode D2 electrically connected to the branch wiring 9 and a branch wiring 11 connected to the other end of the diode D2. Furthermore, the one end of the capacitor C1 is connected to the one end of the switch S3 through a diode D3 electrically connected to the branch wiring 9, a resistor R3 connected in series with the diode D3, and the branch wiring 11 connected to the other end of the resistor R3. However, the diode D2 is disposed in a direction from the switch S3 toward the capacitor C1 as its forward direction, and the diode D3 is disposed in a direction from the capacitor C1 toward the switch S3 (the resistor R3) as its forward direction.

On the other hand, the other end of the capacitor C1 is connected to one end of the switch S4 through the branch wiring 10. The other end of the switch S4 is connected through a resistor R4 to a branch wiring 13 which is connected to the ground potential (earth). In other words, the other end of the switch S4 is connected to the ground through the resistor R4. Furthermore, as described above, the other end of the capacitor C1 is connected to the other end of the switch S2 through the resistor R2 connected to the branch wiring 10. Further, a well-known ceramic capacitor having no polarity is suitable as the capacitor C1, but an electrolytic capacitor having polarity may also be employed.

The other end of the switch S3 is electrically connected to an input terminal of a well-known sample-and-hold circuit 2 through the branch wiring 12, and is connected to the ground through a resistor R5 connected to the branch wiring 12 and the branch wiring 13 connected to the other end of the resistor R5. At this time, an output terminal of the sample-and-hold circuit 2 is connected to an input terminal of an A/D converter (an A/D conversion unit) included in the microcomputer 3. With this configuration, a voltage charged in the capacitor C1 is divided by the resistor R3 and the resistor R5, and the divided voltage is measured as a measurement voltage of the capacitor C1 by the A/D conversion unit. Further, the configuration of the ground fault resistance measuring unit operated by the A/D conversion unit and the microcomputer 3 will be described below.

In addition, about several hundreds (M) of virtual ground fault resistance (the ground fault resistance on the positive electrode side) RLp1 is formed between the power line 5 and the ground on the positive electrode side of the direct-current power supply BAT. Furthermore, about several hundreds (MΩ) of virtual ground fault resistance (the ground fault resistance on the negative electrode side) RLn1 is formed even between the power line 6 and the ground on the negative electrode side of the direct-current power supply BAT.

Furthermore, the voltage boosting circuit 4 is connected to the other end of the main relay R+ through a power line 7 to boost a potential on the positive electrode side supplied from the direct-current power supply BAT through the main relay R+, and supplies the boosted potential to a power line 14 on the secondary side of the voltage boosting circuit 4. On the other hand, a power line 8 is connected to the other end of the main relay R−. The power line 8 is provided to be extended on the secondary side of the voltage boosting circuit 4, and supplies the boosted power to a load (not illustrated) through the power line 14 and the power line 8.

Detailed Configuration of Ground Fault Resistance Measuring Unit

Figure 2:
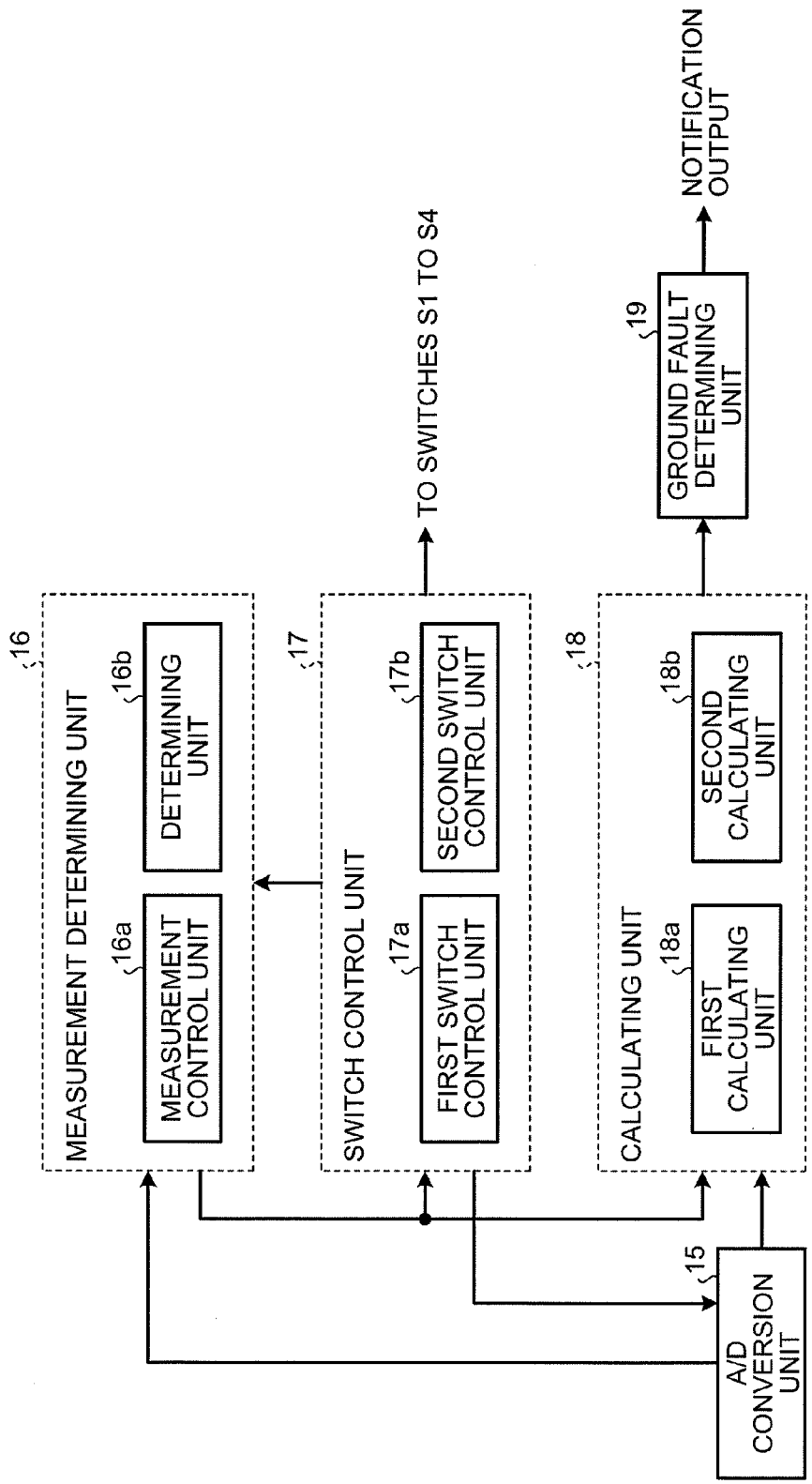
FIG. 2 is a diagram for describing a schematic configuration a ground fault resistance measuring unit which is realized by a program executed by a microcomputer of the insulation detecting device of the first embodiment of the present invention.
Figure 3:
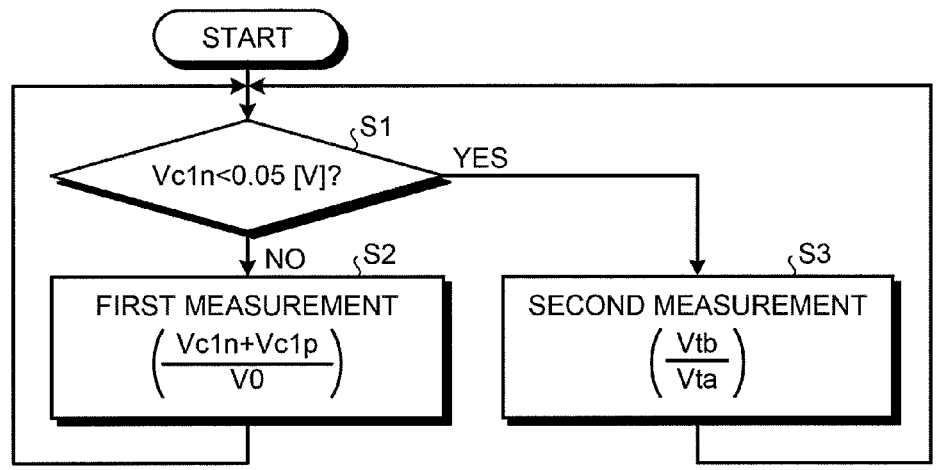
FIG. 3 is a diagram illustrating a flow of a measuring operation in the insulation detecting device of the first embodiment of the present invention.
Figure 5:
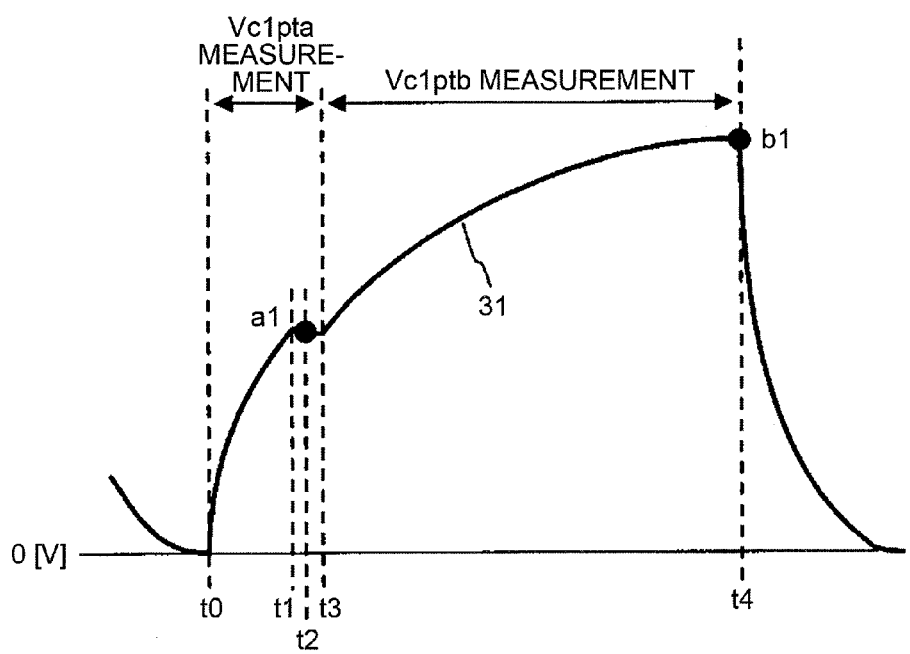
FIG. 5 is a diagram for describing a change in charged voltage at the time of a Vc1p measurement of the insulation detecting device of the first embodiment of the present invention.

FIG. 2 is a diagram for describing a schematic configuration of the ground fault resistance measuring unit which is realized by a program executed by the microcomputer of the insulation detecting device of the first embodiment of the present invention. FIG. 3 is a diagram for describing a measuring operation in the insulation detecting device of the first embodiment of the present invention. FIGS. 4A and 4B are diagrams for describing the measuring operation in the insulation detecting device of the first embodiment of the present invention. FIG. 5 is a diagram for describing a change in charged voltage at the time of a Vc1p measurement of the insulation detecting device of the first embodiment of the present invention. In this case, FIG. 4A is a diagram illustrating the measuring operation of a ground fault resistance RL according to a first measurement of the first embodiment. Further, FIG. 4B is a diagram illustrating the measuring operation of the ground fault resistance RL according to a second measurement of the first embodiment.

First, the description will be made based on FIGS. 1 and 2 about the configuration and the operation of the ground fault resistance measuring unit which measures the ground fault resistance and is realized by a program executed by the microcomputer 3 included in the insulation detecting device of the first embodiment of the present invention.

As illustrated in FIG. 2, the ground fault resistance measuring unit of the first embodiment includes a well-known A/D converter (an A/D conversion unit) 15 which is included in the microcomputer 3, a measurement determining unit 16 which is realized by the program executed by the microcomputer 3, a switch control unit 17, a calculating unit 18, and a ground fault determining unit 19.

The measurement determining unit 16 includes a measurement control unit (measurement circuit) 16a and a determining unit (determining means) 16b. The measurement control unit 16a controls the sample-and-hold circuit 2 and the A/D conversion unit 15, and measures the charged voltage of the capacitor C1 divided by the resistors R3 and R5 as a measurement voltage. The determining unit 16b determines whether a positive electrode voltage of the direct-current power supply BAT at the time of a Vc1n measurement is higher than the ground potential of the insulation detecting device 1 (that is, whether a voltage applied to the capacitor C1 at the time of the Vc1n measurement is in a reversed polarity) based on a measurement voltage Vc1n of the capacitor C1 at the time of the Vc1n measurement measured by the A/D conversion unit 15. In addition, the determining unit 16b outputs the determination result to the switch control unit 17 and the calculating unit 18. At this time, as described in detail below about a measurement principle of the ground fault resistance, the determining unit 16b makes a determination based only on the measurement voltage Vc1n of the capacitor C1 charged in the Vc1n measurement, and determines whether the measurement voltage Vc1n in the Vc1n measurement is about 0 V (zero volt) (specifically, preferably about 10 mV in consideration of noises). Further, the determination may be performed on all the measurement voltages in a V0 measurement, the Vc1n measurement, and the Vc1p measurement, but as described in detail below about the measurement principle of the ground fault resistance, the measurement voltage in the V0 measurement and the Vc1p measurement does not become about 0 V except the measurement voltage Vc1n in the Vc1n measurement. Therefore, it is preferable that the determination be performed based only on the measurement voltage Vc1n of the capacitor C1 charged in the Vc1n measurement. In addition, a determining method of the determining unit 16b will be described below.

The switch control unit 17 is a control unit which controls the turning on/off of the switches S1 to S4 to switch an operation between the charging to the capacitor C1 and the measuring of the charged voltage. The switch control unit 17 includes a first switch control unit 17a and a second switch control unit (control means) 17b, and can independently control the switches S1 to S4. In addition, in a case where the determining unit 16b determines that the measurement voltage in the Vc1n measurement is about 0 V, the switch control unit 17 of the first embodiment causes the second switch control unit 17b instead of the first switch control unit 17a to perform the control on the switches S1 to S4 for the Vc1p measurement and a measurement and discharge after the Vc1p measurement.

Therefore, similarly to the related art, the first switch control unit 17a of the first embodiment controls the respective periods of the V0 measurement, the Vc1n measurement, and the Vc1p measurement to be about several 100 ms, and controls the period of the measurement and discharge after each measurement to be about ½ to ¼ times several 100 ms. On the other hand, the second switch control unit 17b of the first embodiment controls only the switches S1 to S4 for the Vc1p measurement and the measurement and discharge after the Vc1p measurement. Further, the control on the switches S1 to S4 performed by the first and second switch control units 17a and 17b will be described in detail below.

The calculating unit 18 includes a first calculating unit 18a and a second calculating unit (calculating means) 18b, and includes table data (not illustrated) which corresponds to calculation results of the first calculating unit 18a and the second calculating unit 18b. The first calculating unit 18a of the first embodiment calculates (Vc1n+Vc1p)/V0 based on a voltage V0 measured in the V0 measurement, a voltage Vc1n measured in the Vc1n measurement, and a voltage Vc1p measured in the Vc1p measurement, and calculates the ground fault resistance RL with reference to the table data based on the obtained calculated value. On the other hand, as described in detail below about the measurement principle of the ground fault resistance, the second calculating unit 18b calculates a ratio (for example, Vtb/Vta) of the measurement voltages based on voltages Vta and Vtb measured in the Vc1p measurement under the control of the second switch control unit 17b, and calculates the ground fault resistance RL with reference to the table data based on the obtained ratio.

The ground fault determining unit 19 is a means which determines a ground fault (monitoring of an insulation status) based on the ground fault resistance RL calculated by the calculating unit 18. For example, the ground fault determining unit 19 compares a resistance value as a predetermined reference for determining the ground fault with the ground fault resistance RL to determine the presence or absence of the ground fault and to monitor the insulation status. In a case where the ground fault is detected, the ground fault determining unit 19, for example, notifies the occurrence of the ground fault to a higher control device.

Next, an operation of calculating the ground fault resistance RL in the insulation detecting device 1 of the first embodiment (that is, an operation of detecting the insulation status) will be described based on FIGS. 3 to 5. Further, in the following description, the determination on the measurement voltage performed by the determining unit 16b is desirably performed in a measurement and discharge period after the Vc1n measurement, but the first embodiment is not limited to the measurement and discharge period after the Vc1n measurement.

As illustrated in FIG. 3, the charging of the capacitor C1 in the insulation detecting device 1 of the first embodiment and the measuring of the charged voltage charged in the capacitor C1 are changed according to whether the measurement voltage in the Vc1n measurement performed by the determining unit 16b in step S1 is about 0 V (for example, whether the measurement voltage is smaller than several 10 mV or equal to or more than several 10 mV). In other words, in step S1, in a case where it is determined that the measurement voltage in the Vc1n measurement is not about 0 V (for example, the measurement voltage is not smaller than several 10 mV), the ground fault resistance RL is calculated as the first measurement of step S2 based on the measurement voltages V0, Vc1n, and Vc1p of the capacitor C1 charged in the V0 measurement, the Vc1n measurement, and the Vc1p measurement similarly to the related art.

In the first measurement of step S2, the charging and discharging of the capacitor C1 is controlled by the first switch control unit 17a. Furthermore, the first calculating unit 18a calculates (Vc1n+Vc1p)/V0 based on the measurement voltages V0, Vc1n, and Vc1p and refers to the table data based on the calculation result, and thus the ground fault resistance RL is calculated.

On the other hand, in a case where it is determined in step S1 that the measurement voltage in the Vc1n measurement is about 0 V (for example, a voltage smaller than several 10 mV), the ground fault resistance RL is calculated as the second measurement of step S3 based on the measurement voltages Vta and Vtb of the capacitor C1 charged in the Vc1p measurement as described about the measurement principle of the ground fault resistance.

In the second measurement of step S3, the charging and discharging of the capacitor C1 in the Vc1p measurement is controlled by the second switch control unit 17b. Furthermore, the second calculating unit 18b calculates Vtb/Vta based on the measurement voltages Vta and Vtb and refers to the table data based on the calculation result, and thus the ground fault resistance RL is calculated.

Hereinafter, an operation of calculating the ground fault resistance RL by the first measurement (that is, an operation of detecting the insulation status) will be described based on FIG. 4A.

First, the first switch control unit 17a controls the switching of the switches S1 to S4 such that the switches S1 and S2 are turned on for a V0 measurement 5. Therefore, a path (a first path) from the positive electrode of the direct-current power supply BAT to the negative electrode of the direct-current power supply BAT through the diode D1, the resistor R1, the capacitor C1, and the resistor R2 is formed, and the capacitor C1 is charged with almost the same voltage as the direct-current power supply BAT. At this time, the switches S3 and S4 are turned off. In addition, similarly to the related art, a period of the V0 measurement is a time necessary for charging the capacitor C1 at the same voltage as the direct-current power supply BAT. The period of the V0 measurement is appropriately selected according to the capacitance of the capacitor C1 and the resistance values of the resistors R1 and R2 (for example, 0.4 s in the first embodiment).

After the period of a V0 measurement 20, the first switch control unit 17a turns off the switches S1 and S2, and then turns on the switches S3 and S4 in order to measure the charged voltage of the capacitor C1 charged in the V0 measurement 20 and to discharge the charged voltage. Therefore, a path (a fourth path) from the one end of the capacitor C1 to the ground through the diode D3, the resistor R3, and the resistor R5 and from the other end of the capacitor C1 to the ground through the resistor R4 is formed. Herein, the measurement control unit 16a controls the sample-and-hold circuit 2 and the A/D conversion unit 15, and measures the charged voltage of the capacitor C1 as the measurement voltage (a voltage divided by the resistors R3 and R5). Further, since the fourth path formed in a period of a measurement and discharge 21 serves as a path for discharging the voltage charged in the capacitor C1, it is desirable that the voltage of the capacitor C1 be measured as quickly as possible after the fourth path is formed.

Next, after the period of the measurement and discharge 21, the first switch control unit 17a turns off the switch S3, and then turns on the switch S1 for a Vc1n measurement 22. Therefore, a path (a second path) from the power line 5 connected to the positive electrode of the direct-current power supply BAT to the ground through the diode D1, the resistor R1, the capacitor C1, and the resistor R4 is formed, and the capacitor C1 is charged. At this time, the switches S2 and S3 are turned off. In the second path, since the virtually-generated ground fault resistances RLn1 and RLn2 are commonly connected to the ground, the potential on the negative electrode side of the direct-current power supply BAT also affects the charging of the capacitor C1 through the ground. Furthermore, since the virtually-generated ground fault resistance RLp2 between the voltage of the power line 14 on the secondary side connected to the boosting output terminal of the voltage boosting circuit 4 and the ground is also connected to the ground, in a case where the voltage boosting circuit 4 is in a boosting operation, the boosting voltage of the voltage boosting circuit 4 also affects the charging of the capacitor C1.

After the period of the Vc1n measurement 22, the first switch control unit 17a turns off the switch S1 and then turns on the switch S3 to form the fourth path in the period of a measurement and discharge 23 in order to measure the charged voltage of the capacitor C1 charged in the Vc1n measurement 22 and to discharge the charged voltage. After the fourth path is formed, the measurement control unit 16a measures the charged voltage of the capacitor C1 as the measurement voltage. Herein, the determining unit 16b determines whether the measurement voltage of the capacitor C1 by the measurement control unit 16a is about 0 V (for example, a voltage smaller than several 10 mV).

Next, after the period of the measurement and discharge 23, the first switch control unit 17a turns off the switches S3 and S4 and then turns on the switches S1 and S2 in order to form the first path again for a V0 measurement 24, so that the capacitor C1 is charged to almost the same voltage as that of the direct-current power supply BAT.

After the period of the V0 measurement 24, the first switch control unit 17a turns off the switches S1 and S2 and then turns on the switches S3 and S4 to form the fourth path during the period of a measurement and discharge 25. After the fourth path is formed, the measurement control unit 16a measures the charged voltage of the capacitor C1 as the measurement voltage.

Next, after the period of the measurement and discharge 25, the first switch control unit 17a turns off the switch S4 and then turns on the switch S2 for a Vc1p measurement 26. Therefore, a path (a third path) from the ground to the negative electrode of the direct-current power supply BAT is formed through the resistor R5, the diode D2, the capacitor C1, and the resistor R2, and the capacitor C1 is charged. At this time, the switches S1 and S4 are turned off. In the third path, since the virtually-generated ground fault resistance RLp1 is connected to the ground, the potential on the positive electrode side of the direct-current power supply BAT also affects the charging of the capacitor C1 through the ground. Furthermore, since the virtually-generated ground fault resistance RLp2 between the voltage of the power line 14 on the secondary side connected to the boosting output terminal of the voltage boosting circuit 4 and the ground is also connected to the ground, in a case where the voltage boosting circuit 4 is in a boosting operation, the boosting voltage of the voltage boosting circuit 4 also affects the charging of the capacitor C1.

After the period of the Vc1p measurement 26, the first switch control unit 17a turns off the switch S2 and then turns on the switch S4 to form the fourth path in the period of a measurement and discharge 27 in order to measure the charged voltage of the capacitor C1 charged in the Vc1p measurement 26. After the fourth path is formed, the measurement control unit 16a measures the charged voltage of the capacitor C1 as the measurement voltage, the first calculating unit 18a calculates the ground fault resistance RL based on the measurement voltage V0 in a period of a measurement and discharge 25 and the measurement voltage Vc1p in a period of a measurement and discharge 27. In this calculation, first, the first calculating unit 18a calculates (Vc1n+Vc1p)/V0 based on two measurement voltages V0 and Vc1n, and the measurement voltage Vc1p obtained in the respective measurements described above. Next, the first calculating unit 18a refers to the table data based on the obtained calculated value, and calculates the ground fault resistance RL.

The ground fault determining unit 19 outputs the occurrence of the ground fault and the insulation status to the higher control device based on the calculated ground fault resistance RL.

As described above, by repeatedly performing the charging of the capacitor C1 from the V0 measurement 20 to the measurement and discharge 27 corresponding to the Vc1p measurement 26 and the measuring and discharging of the voltage charged of the capacitor C1, the ground fault resistance RL is calculated and sequentially the occurrence of the ground fault and the insulation status are output to the higher control device in real time.

Next, the description will be made based on FIG. 4B about an operation of calculating the ground fault resistance RL (including an operation of detecting the insulation status) in a case where the output voltage of the voltage boosting circuit 4 becomes larger, the ground potential of the insulation detecting device 1 becomes higher than the positive electrode voltage of the direct-current power supply BAT by a potential (a potential at point A) divided at a resistance ratio of the output voltage on the secondary side of the voltage boosting circuit 4 and two ground fault resistances RLp2 and RLn2, and the measurement voltage in the Vc1n measurement is about 0 V (for example, a case where the voltage is smaller than several 10 mV).

As can be seen from FIG. 4B, even in a case where the ground potential of the insulation detecting device 1 is higher than the positive electrode voltage of the direct-current power supply BAT, the measurement determining unit 16, the first switch control unit 17a, and the first calculating unit 18a perform the measuring and discharging of the charged voltage in the periods of the V0 measurement 20 and the measurement and discharge 21, similarly to the case where the positive electrode voltage of the direct-current power supply BAT illustrated in FIG. 4A is higher than the ground potential of the insulation detecting device 1. Furthermore, the same operations as those illustrated in FIG. 4A are performed until the charging of the capacitor C1 by the Vc1n measurement 22 after the period of the measurement and discharge 21, and the measuring and discharging of the charged voltage of the capacitor C1 in the period of the measurement and discharge 25 after the V0 measurement 24.

On the other hand, in the period of the measurement and discharge 23, the determining unit 16b determines whether the measurement voltage of the capacitor C1 charged in the Vc1n measurement is about 0 V (for example, a voltage smaller than several 10 mV) so as to determine whether the positive electrode voltage of the direct-current power supply BAT is higher than the ground potential of the insulation detecting device 1 based on the measurement voltage of the capacitor C1 by the measurement control unit 16a. Herein, FIG. 4B illustrates a determination result in which the measurement voltage of the capacitor C1 becomes about 0 V (for example, a voltage smaller than several 10 mV), and the determination result is output to the calculating unit 18.

The determination result is also output to the switch control unit 17 from the determining unit 16b, the control of the switch in the Vc1p measurement is handed from the first switch control unit 17a to the second switch control unit 17b based on the determination result, and the second switch control unit 17b performs a Vc1pta measurement 28.

In other words, after the period of the measurement and discharge 25, the second switch control unit 17b first turns off the switch S4 in the switches S3 and S4 which have been turned on for the measurement and discharge 25, and then turn on the switch S2, so that the capacitor C1 is charged as the Vc1*pta* measurement through the third path. Next, after a charging period in the Vc1*pta* measurement 28 (that is, a period corresponding to time ta shown in the description of the measurement principle of the ground fault resistance), the second switch control unit 17*b* turns off the switch S2 and then turns on the switch S4 to form the fourth path in order to measure the charged voltage of the capacitor C1 charged through the third path of the Vc1*pta* measurement 28. Through such a switching operation, the second switch control unit 17*b* of the first embodiment charges the capacitor C1 in a period of time points t0 to t1 illustrated in FIG. 5 (that is, time ta shown in the description of the measurement principle of the ground fault resistance). At the time point t1, the fourth path is formed by turning off the switch S2 and then turning on the switch S4. At a time point t2, the measurement control unit 16*a* measures the measurement voltage Vta. The second calculating unit 18*b* retains the measurement voltage as the measurement voltage Vta. After the measurement at the time point t2, the second switch control unit 17*b* immediately turns off the switch S4 and then turns on the switch S2 (a time point t3), and further charges the capacitor C1 through the third path as a Vc1*ptb* measurement 29.

At this time, as illustrated in a voltage waveform 31 of the capacitor C1 of FIG. 5, the charged voltage of the capacitor C1 is slightly reduced at the time points t1 to t3, but such a reduction in the charged voltage is extremely small, so that it affects so small on the calculation of a charged voltage ratio Vtb/Vta to be described below and the ground fault resistance RL. Furthermore, since the time necessary for the time points t1 to t3 is determined in advance, the influence on the ground fault resistance RL can be reduced by creating the table data in consideration of the reduced amount of the charged voltage.

Next, after a predetermined period (a period between the time points t3 and t4), the second switch control unit 17*b* turns off the switch S2 and then turns on the switch S4 to form the fourth path in order to measure the charged voltage of the capacitor C1 additionally charged in the Vc1*ptb* measurement 29. At this time, a total period of the period between the time points t0 and t1 and the period between the time points t3 and t4 is a period corresponding to time tb shown in the description of the measurement principle of the ground fault resistance.

When the fourth path for a measurement and discharge 30 is formed after the Vc1*ptb* measurement 29 as a second charged period, the measurement control unit 16*a* measures the measurement voltage Vtb of the capacitor C1. Thereafter, the second calculating unit 18*b* calculates the ratio Vtb/Vta of the charged voltage. Next, the second calculating unit 18*b* refers to the table data, and calculates the ground fault resistance RL.

The ground fault determining unit 19 outputs the occurrence of the ground fault and the insulation status to the higher control device based on the calculated ground fault resistance RL.

By repeatedly performing the charging of the capacitor C1 from the V0 measurement 20 to the measurement and discharge 30 corresponding to the Vc1*ptb* measurement 29 and the measuring and discharging of the charged voltage of the capacitor C1 as described above, the ground fault resistance RL is calculated and sequentially the occurrence of the ground fault and the insulation status are calculated in real time, and the result is output to the higher control device.

However, since the Vc1*pta* measurement 28 and the Vc1*ptb* measurement 29 illustrated in FIG. 4B are performed based on the determination result of the voltage Vc1*n* charged in the capacitor C1, the determination on whether the voltage Vc1*n* is about 0 V is preferably performed immediately after the voltage Vc1*n* is measured. In addition, in the operation illustrated in FIG. 4B described above, the V0 measurement 24 and the measurement and discharge 25 are performed regardless of the determination result of the voltage Vc1*n* charged in the capacitor C1, but the present embodiment is not limited thereto. For example, in a case where it is determined that the voltage Vc1*n* is about 0 V, the V0 measurement 24 and the measurement and discharge 25 may be not performed, and the Vc1*pta* measurement 28 (including the Vc1*ptb* measurement 29 and the measurement and discharge 30) may be immediately performed after the Vc1*n* measurement 22 and the measurement and discharge 23. Further, this configuration is also the same in a second embodiment to be described below.

As described above, in the insulation detecting device of the first embodiment, first, a case where the ground potential of the insulation detecting device 1 becomes higher than the positive electrode voltage of the direct-current power supply BAT at the time of the Vc1*n* measurement (that is, the potential of the other end of the capacitor C1 connected to the ground becomes higher than the potential of one end of the capacitor C1 connected to the direct-current power supply BAT) is determined by the determining unit 16*b* based on the determination on whether the voltage Vc1*n* obtained at the time of the Vc1*n* measurement is about 0 V. Next, the switch control unit 17 controls the switching of the switches S1 to S4, and controls the charging of the capacitor C1 through the third path and the measuring of the charged voltage of the charged capacitor C1 through the third path. Herein, the measurement determining unit 16 measures the measurement voltage Vta at time ta in the initial switching to the first path and the measurement voltage Vtb at time tb after a predetermined time larger than time ta elapses. Furthermore, based on the measurement voltage Vta of the capacitor C1 at time to and the measurement voltage Vtb of the capacitor C1 after time tb, the calculating unit 18 calculates the ground fault resistance RL formed by compositing the ground fault resistances RLn1, RLp1, RLn2, and RLp2 which are formed between the positive electrode of the direct-current power supply BAT and the ground and between the secondary side of the voltage boosting circuit 4 and the ground. Therefore, in the insulation detecting device of the first embodiment, it is possible to measure the ground fault resistance RL formed between the ground and each of the direct-current power supply BAT and the output on the secondary side of the voltage boosting circuit even in the case of a simple configuration not requiring an additional circuit.

In particular, in the insulation detecting device of the first embodiment, the flying capacitor C1 is charged through the second path connected to the flying capacitor C1 between the positive electrode of the direct-current power supply BAT and the ground, and the positive electrode of the direct-current power supply BAT is disconnected from the flying capacitor C1 after the charging. Thereafter, the measurement control unit 16*a* serving as a measurement circuit is connected to the flying capacitor C1 through the fourth path. The measurement control unit 16*a* measures the voltage charged in the flying capacitor C1. The determining unit 16b monitors the measured voltage. In a case where the determining unit 16b determines that the measured voltage is about 0 V (zero volt), the flying capacitor C1 is charged through the third path connected to the flying capacitor C1 between the ground and the negative electrode of the direct-current power supply BAT. Herein, the first measurement voltage Vta at the first time to and the second measurement voltage Vtb at a second time tb different from the first time after the flying capacitor C1 is connected are measured. Next, since the ground fault resistance RL formed between the direct-current power supply BAT and the ground is calculated based on the first measurement voltage Vta and the second measurement voltage Vtb, it can be realized by a program executed by the microcomputer. As a result, it is possible to measure the ground fault resistance between the ground and each of the direct-current power supply and the voltage boosting circuit using a simple configuration not requiring an additional circuit.

Further, in the insulation detecting device 1 of the first embodiment, even in a case where the potential at point A is higher than the positive electrode of the direct-current power supply BAT, the ON/OFF control of the switches S1 to S4 is performed by the microcomputer 3. Therefore, the power supply (including the ground) of the microcomputer 3 preferably supplies power through a dedicated power line (not illustrated) of the microcomputer 3.

Description of Measurement Principle of Ground Fault Resistance

Figure 6:
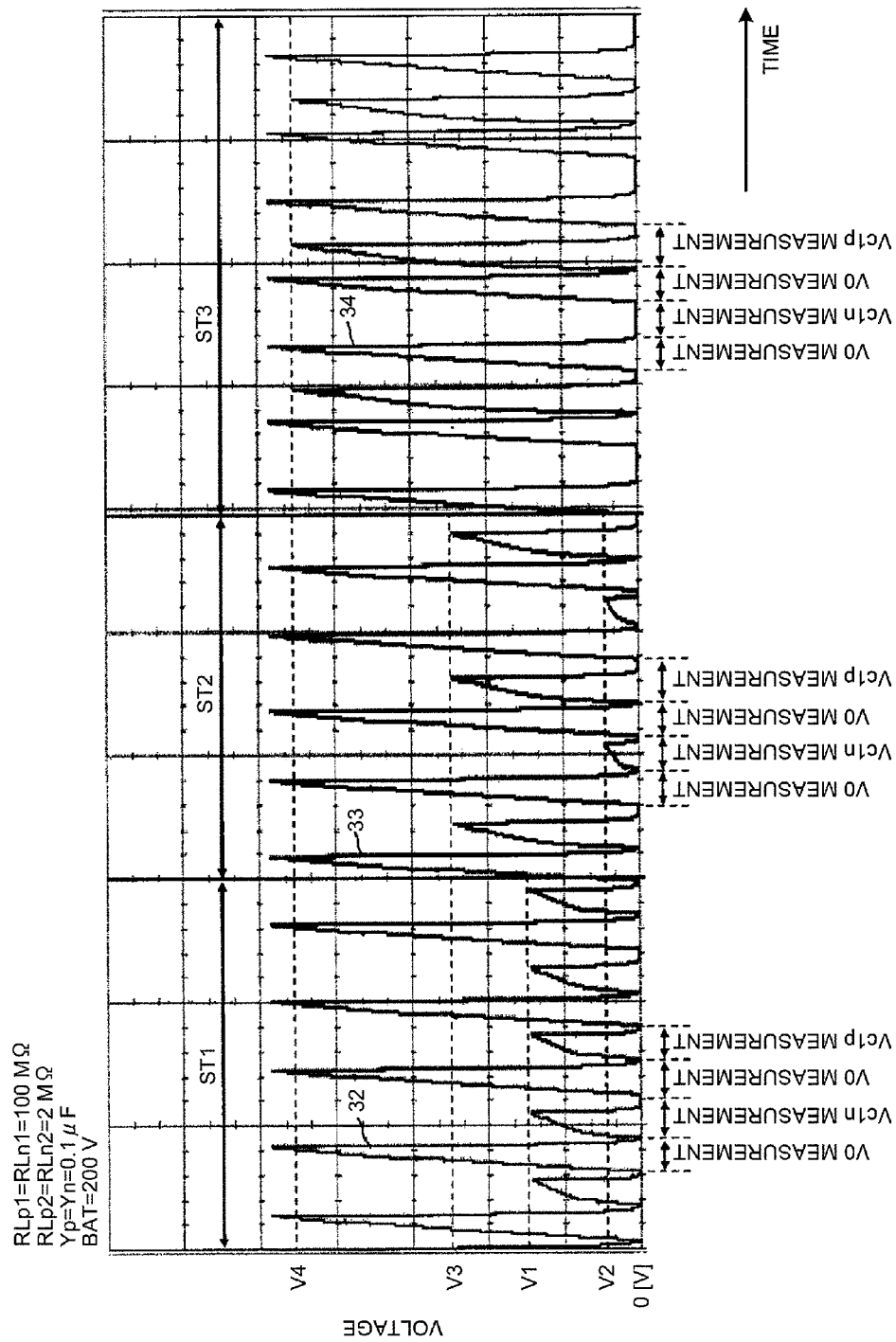
FIG. 6 is a diagram illustrating a simulation result of measurement voltage-time characteristics at the time of a V0 measurement, a Vc1p measurement, and a Vc1n measurement in a case where a secondary voltage is changed by a voltage boosting circuit.
Figure 7:
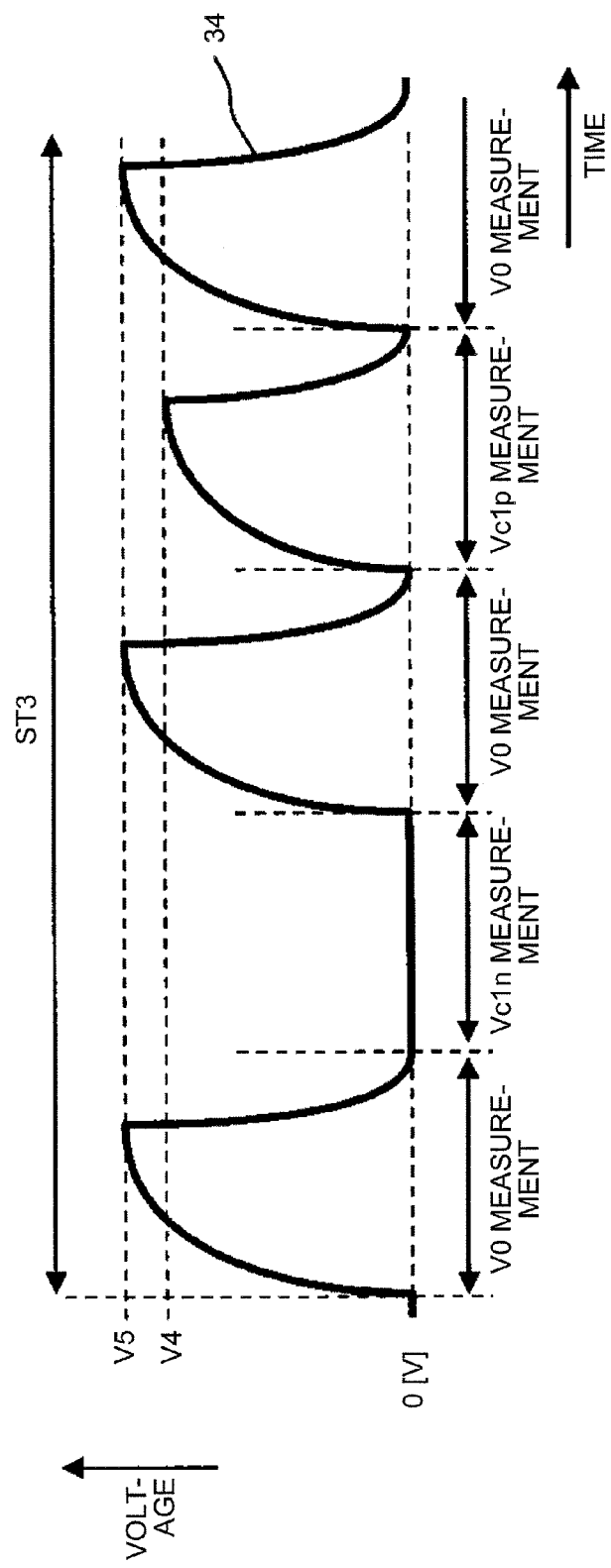
FIG. 7 is an enlarged view for describing a measurement voltage at the time of the V0 measurement, the Vc1p measurement, and the Vc1n measurement in a case where the ground potential is higher than a positive electrode voltage of the direct-current power supply.
Figure 8:
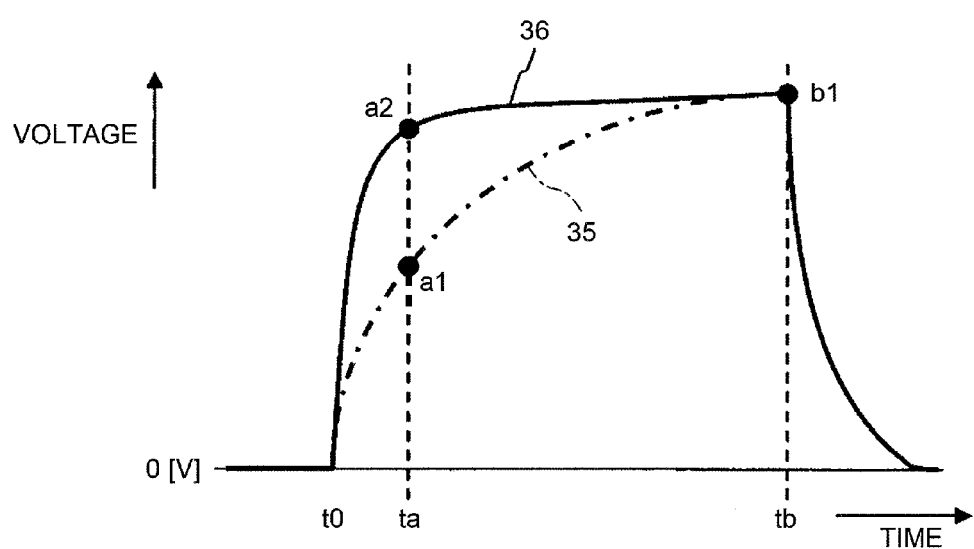
FIG. 8 is a diagram for describing a principle of calculating a ground fault resistance from the measurement voltage in the Vc1p measurement in a case where the ground potential is higher than the positive electrode voltage of the direct-current power supply.

FIG. 6 is a diagram illustrating a simulation result of measurement voltage-time characteristics at the time of the V0 measurement, the Vc1p measurement, and the Vc1n measurement in a case where the secondary voltage is changed by the voltage boosting circuit, FIG. 7 is an enlarged view for describing a measurement voltage at the time of the V0 measurement, the Vc1p measurement, and the Vc1n measurement in a case where the ground potential is higher than the positive electrode voltage of the direct-current power supply, and FIG. 8 is a diagram for describing a principle of calculating the ground fault resistance from the measurement voltage in the Vc1p measurement in a case where the ground potential is higher than the positive electrode voltage of the direct-current power supply. Hereinafter, the calculation principle of the ground fault resistance RL will be described based on FIGS. 6 to 8. Further, for the sake of simplicity of the description, the respective measurement times of the V0 measurement, the Vc1p measurement, and the Vc1n measurement illustrated in FIGS. 6 and 7 are described without dividing the charging period of the capacitor C1 and the discharging period of measuring the voltage charged in the capacitor C1 and discharging the charged voltage.

In particular, a simulation result illustrated in FIG. 6 shows the charged voltage of the capacitor C1 at the time of the charging to the capacitor C1 and at the time of the discharging by the turned-on switches S3 and S4 in the V0 measurement, the Vc1p measurement, and the Vc1n measurement. At this time, two main relays R+ and R− are in the ON state. In addition, a simulation result illustrated in FIG. 6 shows a voltage change in a case where the ground fault resistance RLp1=RLn1=100 MΩ, the ground fault resistance RLp2=RLn2=2 MΩ), capacitance Yp of a Y capacitor on the positive electrode side of the direct-current power supply BAT=capacitance Yn of a Y capacitor on the negative electrode side=0.1 μF, and the output voltage Vb of the direct-current power supply BAT=200 V.

In addition, a voltage waveform 32 illustrated in a period ST1 of FIG. 6 is a voltage change in a case where the boosting operation of the voltage boosting circuit 4 is not performed. A voltage waveform 33 illustrated in a period ST2 illustrates a voltage change in a case where the boosting operation of the voltage boosting circuit 4 is performed and the potential at the point A illustrated in FIG. 1 is lower than that of the positive electrode of the direct-current power supply BAT. In addition, a voltage waveform 34 illustrated in a period ST3 is a measurement voltage in a case where the boosting operation of the voltage boosting circuit 4 is performed and the potential at point A illustrated in FIG. 1 is higher than that of the positive electrode of the direct-current power supply BAT.

Hereinafter, the measurement voltages obtained in the V0 measurement, the Vc1p measurement, and the Vc1n measurement in the periods ST1 to ST3 will be described.

(a) Period ST1

As can be seen from the values at the time of the Vc1p measurement and the Vc1n measurement of the voltage waveform 32 in the period ST1, in a case where the output on the secondary side is not boosted by the voltage boosting circuit 4, the measurement voltages corresponding to the ground fault resistances RLp1 and RLn1 and the ground fault resistances RLp2 and RLn2 are obtained. In other words, since the ground fault resistances RLp1 and RLn1 are equal to each other, the ground fault resistances RLp2 and RLn2 are also equal to each other, and the capacitance Yp of the Y capacitor on the positive electrode side=the capacitance Yn of a Y capacitor on the negative electrode side is also satisfied, the charged voltage Vc1p at the time of the Vc1p measurement and the charged voltage Vc1n at the time of the Vc1n measurement are charged up to the same voltage V1.

(b) Period ST2

As can be seen from the values at the time of the V0 measurement of the voltage waveform 33 in the period ST2, the switches S1 and S2 are turned on at the time of the V0 measurement, and the switches S3 and S4 are turned off. Therefore, since the output voltage on the secondary side by the voltage boosting circuit 4 does not affect the charging to the capacitor C1, the value of the voltage waveform 33 at the time of the V0 measurement in the period ST2 is equal to the value of the voltage waveform 32 at the time of the V0 measurement in the period ST1, and the voltage range thereof corresponds to a voltage change between 0 V at the time of the discharging and a voltage V5 at the time of starting the measuring of the voltage.

On the other hand, as can be seen from the voltage waveform 33, the measurement voltage at the time of the Vc1p measurement and the measurement voltage at the time of the Vc1n measurement are different from each other at the time of the Vc1p measurement and the Vc1n measurement in the period ST2. Hereinafter, the details will be described below.

At the time of the Vc1p measurement, the switch S2 and the switch S3 are turned on to change the capacitor C1, so that the ground potential is supplied to one end of the capacitor C1 through the resistor R5 and the diode D2. At this time, the ground fault resistances RLp2 and RLn2 each formed between the power lines 14 and 8 on the secondary side of the voltage boosting circuit 4 and the ground and the ground fault resistance RLn1 formed between the power line 8 on the negative electrode side of the direct-current power supply BAT and the ground are connected to each other through the ground. In this case, generally, the ground potential set to an intermediate potential between the positive electrode potential and the negative electrode potential of the direct-current power supply BAT comes to be a high potential by the potential at point A (a voltage dividing ratio according to the resistance ratio of the ground fault resistances RLp2 and RLn2 and the potential according to the output voltage on the secondary side). As a result, the voltage applied to the capacitor C1 (that is, the voltage applied between one end and the other end of the capacitor C1) becomes larger than the voltage in the period ST1.

Furthermore, since the switch S2 is turned off and the switches S3 and S4 are turned on at the time of measuring the voltage charged in the capacitor C1, the measurement can be made without an influence of the rising of the ground potential. As a result, the value of the voltage waveform 33 in the period ST2 at the time of the Vc1$p$ measurement reaches a voltage V3 higher than the value of the voltage waveform 32 at the time of the Vc1$p$ measurement in the period ST1. Therefore, assuming Vup as a rising amount of the ground potential in the period ST2 with respect to the ground potential in the period ST1, the measurement voltage Vc1$p$ in the Vc1$p$ measurement in the period ST1 becomes the voltage V1, so that the voltage V3 which is the measurement voltage Vc1$p$ at the time of the Vc1$p$ measurement in the period ST2 satisfies V3=V1+Vup.

On the other hand, since the switch S1 and the switch S4 are turned on to charge the capacitor C1 at the time of the Vc1$n$ measurement, the positive electrode potential of the direct-current power supply BAT is supplied to the one end of the capacitor C1 through the diode D1 and the resistor R1. In addition, the ground is connected to the other end of the capacitor C1 through the resistor R4. At this time, similarly to the period ST1 described above, the ground potential becomes higher than the original ground potential by the potential at point A, and the potential applied to the other end of the capacitor C1 also becomes higher than the original ground potential. As a result, the voltage applied to the capacitor C1 becomes a voltage smaller than that in the period ST1.

Herein, since the switch S1 is turned off and the switches S3 and S4 are turned on at the time of measuring the voltage charged in the capacitor C1, the measurement can be made without the influence of the rising of the ground potential. As a result, the value of the voltage waveform 33 in the period ST2 at the time of the Vc1$n$ measurement becomes a voltage waveform in which the voltage V2 lower than the value of the voltage waveform 32 at the time of the Vc1$n$ measurement in the period ST1 becomes the highest voltage. Therefore, assuming Vup as a rising amount of the ground potential in the period ST2 with respect to the period ST1, the measurement voltage Vc1$n$ in the Vc1$n$ measurement in the period ST1 becomes the voltage V1, so that the voltage V2 which is the measurement voltage Vc1$n$ at the time of the Vc1$n$ measurement in the period ST2 satisfies V2=V1−Vup.

As described above, the ground fault resistance RL is calculated by calculating (Vc1$n$+Vc1$p$)/V0 based on the measurement voltages V0, Vc1$n$, and Vc1$p$ and by referring to the table data based on the calculation result. Therefore, (Vc1$n$+Vc1$p$)/V0 in the period ST1 described above is calculated as the following equation (1).

$$(Vc1n + Vc1p)/V0 = (V1 + V1)/V0 = 2 \times V1/V0 \quad (1)$$

On the other hand, (Vc1$n$+Vc1$p$)/V0 in the period ST2 described above is calculated as the following equation (2).

$$\begin{aligned}(Vc1n + Vc1p)/V0 &= (V2 + V3)/V0 \quad (2)\\ &= ((V1 - Vup) + (V1 + Vup))/V0 \\ &= (V1 + V1)/V0 \\ &= 2 \times V1/V0\end{aligned}$$

As can be seen from Equation (2), the rising amount Vup of the ground potential in the period ST2 does not affect the measurement and the calculation, and the calculation results of the ground fault resistances RL in the period ST1 and the period ST2 are equal to each other. Therefore, in the period ST1 and the period ST2, the ground fault resistance RL can be calculated by calculating (Vc1$n$+Vc1$p$)/V0 based on the measurement voltages V0, Vc1$n$, and Vc1$p$ and by referring to the table data based on the calculation result.

(c) Period ST3

As can be seen from the value of a voltage waveform 34 at the time of the V0 measurement in the period ST3 illustrated in FIGS. 6 and 7, the value of the voltage waveform 34 at the time of the V0 measurement in the period ST3 is equal to the value of the voltage waveform 32 at the time of the V0 measurement in the period ST1 similarly to the time of the V0 measurement in the period ST2, and the voltage range thereof corresponds to a voltage change between 0 V at the time of the discharging and the voltage V5 at the time of starting the measuring of the voltage.

On the other hand, as can be seen from the voltage waveform 34 in the period ST3 illustrated in FIGS. 6 and 7, the measurement voltage at the time of the Vc1$p$ measurement and the measurement voltage at the time of the Vc1$n$ measurement are different from each other at the time of the Vc1$p$ measurement and the Vc1$n$ measurement in the period ST3. Hereinafter, the details will be described below.

At the time of the Vc1$p$ measurement, the switch S2 and the switch S3 are turned on to charge the capacitor C1, so that the potential at point A becomes a potential higher than that at the time of the Vc1$p$ measurement in the period ST2, and as a result, the voltage applied to the capacitor C1 (that is, the voltage applied between the one end and the other end of the capacitor C1) becomes larger than that in the period ST2. At this time, similarly to the period ST2, the measurement can be made without the influence of the rising of the ground potential at the time of measuring the voltage charged in the capacitor C1. As a result, the value of the voltage waveform 34 in the period ST3 at the time of the Vc1$p$ measurement reaches a voltage V4 higher than the value of the voltage waveform 33 in the period ST2 at the time of the Vc1$p$ measurement.

On the other hand, the potential at point A is higher than the positive electrode potential of the direct-current power supply BAT at the time of the Vc1$n$ measurement, so that the potential applied to the other end of the capacitor C1 becomes higher than that applied to the one end of the capacitor C1 when the switch S1 and the switch S4 are turned on to charge the capacitor C1. In other words, the other end of the capacitor C1 is applied with a potential higher than the potential (the positive electrode potential of the direct-current power supply BAT) applied to the one end of the capacitor C1. At this time, as can be seen from FIG. 1, the diode D1 is disposed in a direction from the positive electrode of the direct-current power supply BAT to the one end of the capacitor C1 through the switch S1 as its forward direction. As a result, the capacitor C1 is not charged at the time of the Vc1$n$ measurement.

Herein, the switch S1 is turned off and the switches S3 and S4 are turned on at the time of measuring the voltage charged in the capacitor C1, so that the measurement can be made without the influence of the rising of the ground potential similarly to the period ST2. As a result, at the time of the Vc1$n$ measurement in the period ST3, almost the same voltage as the ground potential (that is, about 0 V) is applied to an input terminal for A/D conversion of the microcomputer 3, and the voltage measured by the A/D converter of the microcomputer 3 becomes about 0 V. As a result, as illustrated in FIGS. 6 and 7, the value of the voltage waveform 34 at the time of the Vc1$n$ measurement in the period ST3 is different from that in the periods ST1 and ST2, and becomes about 0 V over the entire period ST3.

Further, it is also considered that the diode D1 illustrated in FIG. 1 may be not provided, but in this case, the potential at point A is higher than the positive electrode potential of the direct-current power supply BAT in the charging period of the capacitor C1, so that the capacitor C1 is charged in the reversed polarity. On the other hand, since it is not assumed that the A/D converter of the microcomputer 3 measures a potential lower than the ground, in a case where a voltage lower than the ground is input at the time of measuring the charged voltage to charge the capacitor C1 in the reversed polarity, the voltage measured in the A/D converter of the microcomputer 3 becomes about 0 V. In other words, even in a case where the diode D1 is not provided, the measurement voltage in the period ST3 becomes about 0 V over the entire period ST3.

As a result, in a case where the boosting operation of the voltage boosting circuit 4 is performed, the applying of the voltage in the reversed polarity from point A to the capacitor C1 through the ground, due to the potential according to the voltage dividing ratio corresponding to the resistance ratio of the ground fault resistances RLp2 and RLn2 and due to the output voltage on the secondary side of the voltage boosting circuit 4, can be determined based on whether the measurement voltage at the time of the Vc1$n$ measurement is about 0 V. However, since the resultant measurement voltage at the time of the Vc1$n$ measurement is mixed with noises from the outside, a reference voltage for the determination is set to about several 10 mV for example in consideration of the noises. In addition, in a case where the measurement voltage at the time of the Vc1$n$ measurement is smaller than several 10 mV, an applied voltage to the capacitor C1 comes to be in the reversed polarity, and it is desirable that it be determined that the ground fault resistance is not possible to be calculated (measured) in the same calculation as that in the period ST2 described above.

FIG. 8 is a diagram for describing a charging characteristic of the capacitor at the time of the Vc1$p$ measurement. Hereinafter, a calculating method (operation method) of the ground fault resistance in a case where the applied voltage to the capacitor C1 is in the reversed polarity will be described based on FIG. 8. In this case, voltage waveforms 35 and 36 of the charging characteristic illustrated in FIG. 8 illustrate the charging characteristic of the capacitor C1 at the time of the Vc1$p$ measurement in a case where the output voltage on the secondary side of the voltage boosting circuit 4 and the ground fault resistances RLp2 and RLn2 are changed in the circuit illustrated in FIG. 1. In particular, the voltage waveform 35 depicted with an alternate long and short dash line shows the charging characteristic in a case where the output voltage on the secondary side of the voltage boosting circuit 4 is 550 V, and the ground fault resistances RLp2 and RLn2 are each 500 k$\Omega$.

On the other hand, the voltage waveform 36 depicted with a solid line shows the charging characteristic in a case where the output voltage on the secondary side of the voltage boosting circuit 4 is 750 V, and the ground fault resistances RLp2 and RLn2 are each 1 M$\Omega$.

In the conventional insulation detecting device, as the measurement voltage at the time of the Vc1$p$ measurement, the voltage Vtb measured only at the time point tb illustrated in FIG. 8 is considered to be the measurement voltage Vc1$p$. In this case, as can be seen from the voltage waveforms 35 and 36 illustrated in FIG. 8, the voltage Vtb at the time point tb is almost the same even in a case where the output voltage on the secondary side of the voltage boosting circuit 4 and the ground fault resistances RLp2 and RLn2 are each different. Therefore, the ground fault resistance is not possible to be calculated only by the measurement voltage Vtb at the time point tb in the Vc1$p$ measurement.

On the other hand, as can be seen from FIG. 8, the voltage in a charging start period (for example, the time point ta) of the capacitor C1 becomes a voltage Vta1 (the voltage at point a1 in the drawing) in the voltage waveform 35 and a voltage Vta2 (the voltage at point a2 in the drawing) in the voltage waveform 36. In other words, the charged voltage of the capacitor C1 in the time point ta in the charging start period of the capacitor C1 becomes a voltage corresponding to a difference between the ground fault resistances RLp2 and RLn2 which do not depend on a voltage applied to the capacitor C1.

Therefore, since the voltage Vta is measured at the time point ta in the charging start period of the capacitor C1 and the voltage Vtb is measured at the time point tb different from the time point ta, the ground fault resistance RL formed by compositing the ground fault resistances RLp1 and RLn1 on the primary side and the ground fault resistances RLp2 and RLn2 on the secondary side can be calculated only by the measurement voltage in a case where the switches S1 and S4 are turned on to charge the capacitor C1 (at the time of the Vc1$p$ measurement).

At this time, in a case where the voltage charged in the capacitor C1 is assumed as Vc, the following equation is obtained.

$$Vc = Vs(1 - \exp(-t/C \times (R+RL))) \quad (3).$$

Herein, in Equation (3), Vs is a voltage applied on the third path through which the capacitor C1 is charged in the Vc1$p$ measurement, C is a capacitance of the capacitor C1, R is a resistance value of a path from the ground to the negative electrode of the direct-current power supply BAT through the capacitor C1 (the resistance value obtained by adding the resistor R2 and the resistor R5), RL is the resistance value of the ground fault resistance RL formed by compositing the ground fault resistances RLp1 and RLn1 on the primary side and the ground fault resistances RLp2 and RLn2 on the secondary side, and t is a charging time.

Herein, Vtb/Vta is considered as a ratio of a charged voltage Vta of the capacitor C1 at the time point to and the charged voltage Vtb of the capacitor C1 at the time point tb.

In this case, the charged voltage ratio Vtb/Vta obtained from Equation (3) becomes as follows.

$$Vtb/Vta = (Vs(1-\exp(-tb/C \times (R+RL))))/(Vs(1-\exp(-ta/C \times (R+RL)))) = (\exp(-tb/C \times (R+RL)))/(\exp(-ta/C \times (R+RL))) \quad (4).$$

Herein, since C (the capacitance of the capacitor C1) and R (the resistance value obtained by adding the resistor R2 and the resistor R5) in Equation (4) are constant values determined according to the circuit configuration, it can be seen that the charged voltage ratio Vtb/Vta does not depend on the output voltage Vs on the secondary side, but is determined by the charging time t (for example, ta and tb) and the ground fault resistance RL.

As an example, in a case where the output voltage VBAT of the direct-current power supply BAT is 200 V, the ground fault resistances RLp1 and RLn1 are 100 MΩ, the ground fault resistance RLn2 is 2 MΩ, a measurement time ta is 0.1 s, and a measurement time tb is 0.3 s, the simulation results of the charged voltage ratio Vtb/Vta of the capacitor C1 at the time of changing the ground fault resistance RLp2 to be 100 MΩ, 200 MΩ, 300 MΩ, 400 MΩ, 500 MΩ, and 1000 MΩ is shown in Table 1 below. Further, Table 1 shows the charged voltage ratio Vtb/Vta in a case where the output voltage VBAT of the direct-current power supply BAT, the ground fault resistances RLp1, RLn1, and RLn2, the measurement times ta and tb are set to be constant, and the output voltage Vs and the ground fault resistance RLp2 on the secondary side are changed.

TABLE 1

Vtb/Vta (VBAT = 200 V, RLp1 = RLn1 = 100 MΩ, RLn2 = 2 MΩ, ta = 0.1 s, tb = 0.3 s)

| Voltage on Secondary Side Vs | Ground Fault Resistance RLp2 [kΩ] | | | | | |
|---|---|---|---|---|---|---|
| [V] | 100 | 200 | 300 | 400 | 500 | 1000 |
| 300 | 2.301 | 2.261 | 2.193 | 2.127 | 2.068 | 1.875 |
| 400 | 2.305 | 2.264 | 2.196 | 2.130 | 2.071 | 1.878 |
| 500 | 2.306 | 2.266 | 2.198 | 2.133 | 2.073 | 1.880 |

As can be seen from Table 1, the charged voltage ratio Vtb/Vta is kept in a constant value for each ground fault resistance RLp2 even in a case where a secondary voltage Vs is changed, and the ground fault resistance RLp2 can be calculated based on the charged voltage ratio Vtb/Vta.

On the other hand, as can be seen from the circuit diagram of FIG. 1, the voltage charged in the capacitor C1 at the time of the Vc1p measurement varies by the ground fault resistance RLp2 and the other ground fault resistances RLp1, RLn1, and RLn2 connected to the ground fault resistance RLp2 through the ground. Therefore, even the insulation detecting device connected to the primary side can calculate the ground fault resistance RL formed by compositing the ground fault resistances RLp1, RLn1, RLp2, and RLn2 based on the charged voltage ratio Vtb/Vta.

As described above, the charging times to and tb are set to fixed times in advance, and the resistance value of the ground fault resistance RL corresponding to the charged voltage ratio Vtb/Vta is calculated in advance and stored as the table data, so that the ground fault resistance RL can be calculated by a relatively simple arithmetic equation described in Equation (4). In this case, the ground fault resistance RL can be calculated by calculating the ratio Vtb/Vta by Equation (4) and by referring to the table data based on the obtained ratio Vtb/Vta, so that the ground fault resistance RL can be calculated on a light calculation load. As a result, since the process from the measuring of the charged voltages Vta and Vtb to the calculation of the ground fault resistance RL can be performed at a high speed, it is possible to obtain a prominent operational advantage in reducing a time taken from the detection of the occurrence of the ground fault to the process corresponding to the ground fault. Further, the configuration may be realized using the charged voltage ratio Vta/Vtb and the table data corresponding to the ratio Vta/Vtb.

In addition, as can be seen from Equation (3), there can be obtained an effect that the output voltage Vs on the secondary side can be calculated based on the calculated ground fault resistance RL using Equation (3).

Second Embodiment

Figure 9:
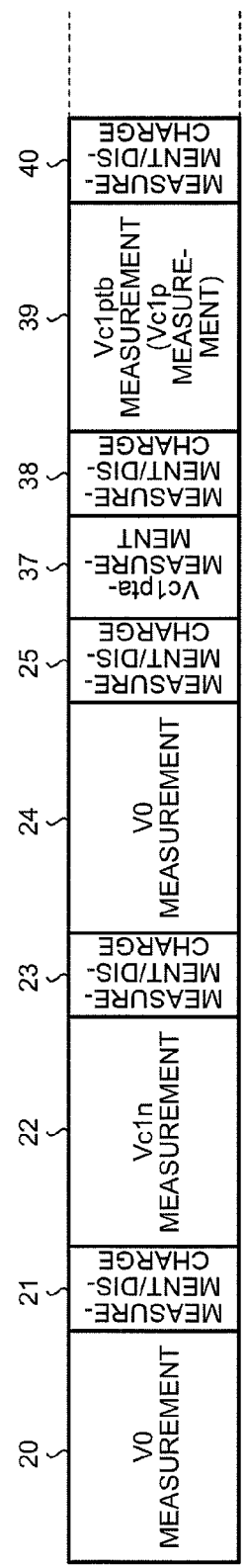
FIG. 9 is a diagram for describing a measuring operation in an insulation detecting device of a second embodiment of the present invention.
Figure 10:
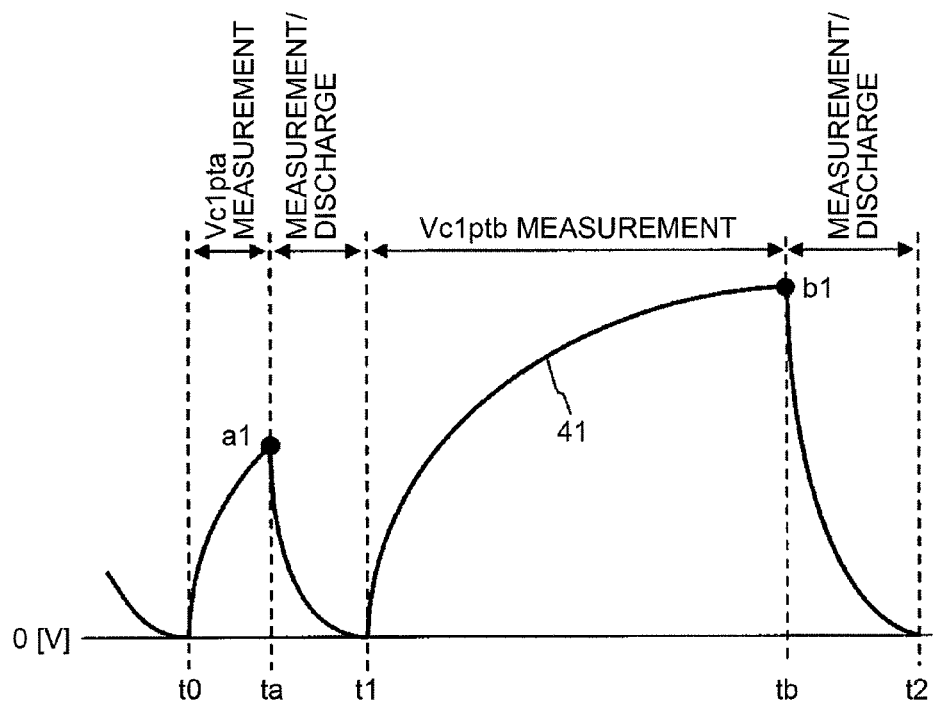
FIG. 10 is a diagram for describing a measurement voltage at the time of a Vc1pta measurement and a Vc1ptb measurement in the insulation detecting device of the second embodiment of the present invention.

FIG. 9 is a diagram for describing a measuring operation in an insulation detecting device of a second embodiment of the present invention, and particularly is a diagram illustrating the measuring operation of the ground fault resistance RL by the second measurement. In addition, FIG. 10 is a diagram for describing a measurement voltage at the time of the Vc1*pta* measurement and the Vc1*ptb* measurement in the insulation detecting device of the second embodiment of the present invention. However, in the insulation detecting device of the second embodiment, the other operations except the measuring operation of the ground fault resistance RL in the second measurement are equal to those of the insulation detecting device of the first embodiment. More specifically, a Vc1*pta* measurement 37 controlled by the second switch control unit 17*b* and a measurement and discharge 38 after the Vc1*pta* measurement 37, and a Vc1*ptb* measurement 39 and a measurement and discharge 40 after the Vc1*ptb* measurement 39 are different from the second measurement of the first embodiment. Therefore, in the following description, the Vc1*pta* measurement 37, the measurement and discharge 38, the Vc1*ptb* measurement 39, and the measurement and discharge 40 controlled by the second switch control unit 17*b* of the second embodiment will be described in detail.

Similarly to the insulation detecting device of the first embodiment, the insulation detecting device of the second embodiment is also operated along a flow of the measuring operation of the insulation detecting device illustrated in FIG. 3, so that the measuring operation of the insulation resistance RL in a case where the measurement voltage in the Vc1*n* measurement is not about 0 V (for example, a voltage is not smaller than several 10 mV) is equal to the first measurement of the first embodiment.

On the other hand, the measuring operation (that is, the second measurement) of the insulation resistance RL in a case where the measurement voltage in the Vc1*n* measurement is about 0 V (for example, a voltage is smaller than several 10 mV) is formed of a period of the measurement and discharge 38 between the Vc1*pta* measurement 37 and the Vc1*ptb* measurement 39 as can be seen from FIG. 9.

In other words, similarly to the first embodiment, in the second measurement of the insulation detecting device of the second embodiment, the charged voltage is first measured and discharged in the periods of the V0 measurement 20 and the measurement and discharge 21 as illustrated in FIG. 9. Furthermore, the charging of the capacitor C1 by the Vc1*n* measurement 22 after the period of the measurement and discharge 21, and the measuring and discharging of the charged voltage of the capacitor C1 in the period of the measurement and discharge 25 after the V0 measurement 24 are performed in the same manner as illustrated in the first embodiment.

Herein, the determining unit 16*b* determines whether the measurement voltage of the capacitor C1 charged in the Vc1*n* measurement is smaller than several 10 mV as the reference voltage in the period of the measurement and discharge 23 based on the measurement voltage of the capacitor C1 by the measurement control unit 16a. Based on the determination in the second measurement, it is determined that the measurement voltage of the capacitor C1 is smaller than several 10 mV, and the determination result detected by the determining unit 16b is output to the calculating unit 18.

In addition, the determination result is also output from the determining unit 16b to the switch control unit 17, the switch control in the Vc1p measurement is handed from the first switch control unit 17a to the second switch control unit 17b based on the determination result, and the second switch control unit 17b performs the Vc1pta measurement 37.

In the Vc1pta measurement 37, after the period of the measurement and discharge 25, the switch S4 in the switches S3 and S4 which have been turned on for the measurement and discharge 25 is turned off, and the switch S2 is turned on, so that the capacitor C1 is charged as the Vc1pta measurement 37 through the third path.

After the period of the Vc1pta measurement 37 (that is, time ta), the second switch control unit 17b of the second embodiment turns off the switch S2, and then turns on the switch S4 to form the fourth path in the period of the measurement and discharge 38 in order to measure the charged voltage of the capacitor C1 charged in the Vc1pta measurement 37 and discharge the charged voltage. Through the measuring of the measurement voltage of the capacitor C1 in the measurement and discharge 38, the measurement control unit 16a measures the measurement voltage Vta (a voltage at point a1 in FIG. 10) of a voltage waveform 41 at the time point ta of FIG. 10, and the second calculating unit 18b retains the voltage as the measurement voltage Vta.

Next, the second switch control unit 17b turns off the switch S4 and then turns on the switch S2 for the Vc1ptb measurement 39 after the period of the measurement and discharge 38. Therefore, the third path from the ground to the negative electrode of the direct-current power supply BAT through the resistor R5, the diode D2, the capacitor C1, and the resistor R2 is formed again, and the capacitor C1 is charged. At this time, since the switches S1 and S4 are turned off, the Vc1ptb measurement 39 becomes equal to the Vc1pta measurement of the first measurement.

Next, after the period of the Vc1ptb measurement 39, the second switch control unit 17b turns off the switch S2, and then turns on the switch S4 to form the fourth path in the period of the measurement and discharge 40 in order to measure the charged voltage of the capacitor C1 charged in the Vc1ptb measurement 39. After the fourth path is formed, the measurement control unit 16a measures the charged voltage of the capacitor C1 as the measurement voltage Vtb (the voltage at point b1 in FIG. 10) at the time point tb of FIG. 10. Thereafter, the second calculating unit 18b calculates the charged voltage ratio Vtb/Vta, refers to the table data corresponding to the obtained ratio Vtb/Vta, and calculates the ground fault resistance RL.

Based on the calculated ground fault resistance RL, the ground fault determining unit 19 outputs the occurrence of the ground fault and the insulation status to the higher control device.

As described above, by repeatedly performing the charging of the capacitor C1 from the V0 measurement 20 to the measurement and discharge 40 corresponding to the Vc1ptb measurement 39 and the measuring and discharging of the voltage charged in the capacitor C1, the ground fault resistance RL is calculated and sequentially the occurrence of the ground fault and the insulation status are calculated in real time, and the result is output to the higher control device, so that the same effect as the insulation detecting device of the first embodiment can be obtained.

At this time, in the insulation detecting device of the second embodiment, the charging of the capacitor C1 by time ta (the charging period ta) and the measuring of the measurement voltage Vta of the charged capacitor C1, and the charging of the capacitor C1 by time tb (the charging period tb) and the measuring of the measurement voltage Vtb of the charged capacitor C1 are separately performed. Therefore, an accuracy of the calculated ground fault resistance RL can be effectively improved more than the first embodiment.

Third Embodiment

FIG. 11 is a diagram for describing a measuring operation in an insulation detecting device of a third embodiment of the present invention, and particularly a diagram illustrating the measuring operation of the ground fault resistance RL by the second measurement. However, even in the insulation detecting device of the third embodiment, the other operations except the measuring operation of the ground fault resistance RL in the second measurement are equal to those of the insulation detecting device of the first embodiment. More specifically, the Vc1pta measurement 37 controlled by the second switch control unit 17b and the measurement and discharge 38 after the Vc1pta measurement 37, and the Vc1ptb measurement 39 and the measurement and discharge 40 after the Vc1ptb measurement 39 are different from the second measurement of the first embodiment. On the other hand, the measuring operation of the third embodiment is different from the second measurement of the second embodiment only in that the operation in which the V0 measurement 24 and the measurement and discharge 25 are not performed (that is, after the measurement and discharge 23, the Vc1pta measurement 37 to the measurement and discharge 40 are immediately performed), but the other operations are equal to those of the second measurement of the second embodiment. Therefore, the following description will be made in detail about the Vc1pta measurement 37, the measurement and discharge 38, the Vc1ptb measurement 39, and the measurement and discharge 40 which are immediately performed after the period of the measurement and discharge 23.

Similarly to the insulation detecting devices of the first and second embodiments, even the insulation detecting device of the third embodiment operates along the flow of the measuring operation of the insulation detecting device illustrated in FIG. 3. Therefore, the measuring operation of the insulation resistance RL in a case where the measurement voltage in the Vc1n measurement is not about 0 V (for example, a voltage is not smaller than several 10 mV) is equal to the first measurements of the first and second embodiments.

On the other hand, as can be seen from FIG. 11, the measuring operation (that is, the second measurement) of the insulation resistance RL in a case where the measurement voltage in the Vc1n measurement is smaller than several 10 mV starts the Vc1pta measurement 37 after the period of the measurement and discharge 23.

In other words, as illustrated in FIG. 11, in the second measurement in the insulation detecting device of the third embodiment, the second switch control unit 17b performs the Vc1pta measurement 37 to the measurement and discharge 40 at a high speed based on the determination result in the determining unit 16b after the measuring of the measurement voltage Vc1n of the capacitor C1 measured in the measurement and discharge 23 after the Vc1n measurement 22. At this time, the measurement voltage Vta at the time point to is measured in the measurement and discharge 38, and the measurement voltage Vtb at the time point tb is measured in the measurement and discharge 40. Herein, after the measuring of the measurement voltage Vtb, the second calculating unit 18b calculates the charged voltage ratio Vtb/Vta, refers to the table data corresponding to the obtained ratio Vtb/Vta, and calculates the ground fault resistance RL.

Based on the calculated ground fault resistance RL, the ground fault determining unit 19 outputs the occurrence of the ground fault and the insulation status to the higher control device.

As described above, by repeatedly performing the charging of the capacitor C1 from the V0 measurement 20 to the measurement and discharge 40 corresponding to the Vc1ptb measurement 39 and the measuring and discharging of the voltage charged in the capacitor C1, the ground fault resistance RL is calculated and sequentially the occurrence of the ground fault and the insulation status are calculated in real time, and the result is output to the higher control device, so that the same effect as the insulation detecting devices of the first and second embodiments can be obtained.

At this time, in the insulation detecting device of the third embodiment, the V0 measurement 24 and the measurement and discharge 25 of the first and second embodiments are not performed, but a time necessary for performing the operation up to the calculation of the ground fault resistance RL in the second measurement can be more effectively shortened.

Fourth Embodiment

Figure 12:
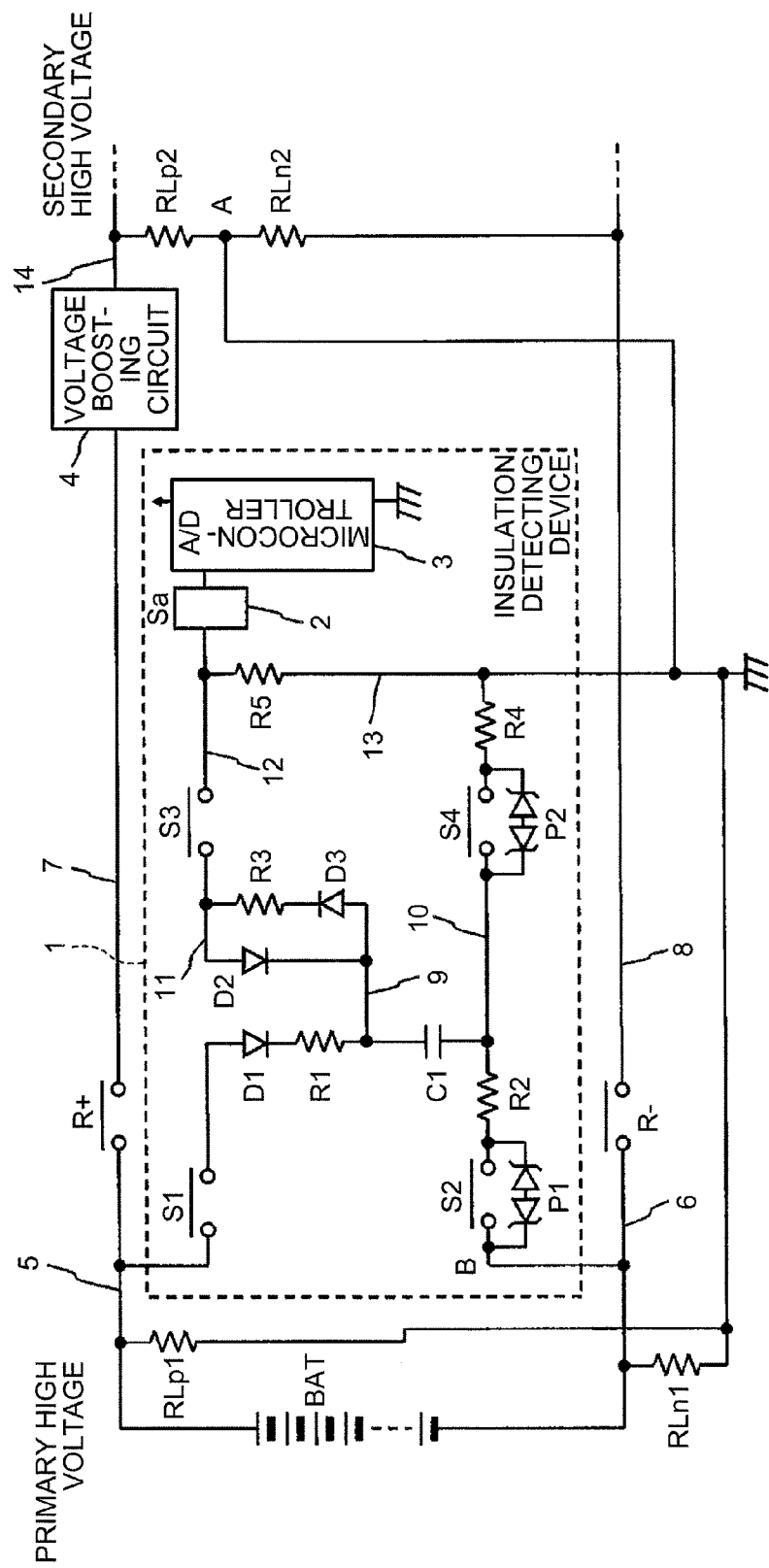
FIG. 12 is a diagram for describing a schematic configuration of an insulation detecting device of a fourth embodiment of the present invention.

FIG. 12 is a diagram for describing a schematic configuration of the switches S2 and S4 in an insulation detecting device of a fourth embodiment of the present invention. However, the insulation detecting device of the fourth embodiment of the present invention is configured equal to the insulation detecting device of the first embodiment only except that the configuration of the switches S2 and S4 and the configuration of the calculating unit 18 of the ground fault resistance measuring unit realized by a program executed by the microcomputer 3 are different. Therefore, in the following description, the configuration and the effect of the switches S2 and S4 of the fourth embodiment will be described in detail.

As illustrated in FIG. 12, in addition to the configuration illustrated in FIG. 1 described above, the insulation detecting device of the fourth embodiment is configured such that protection elements P1 and P2 are connected to the switches S2 and S4 in parallel, respectively. The switches S1 to S4, for example, are each a semiconductor switch made of an optical MOSFET having a withstanding voltage of 550 V, and the protection elements P1 and P2, for example, are each a well-known TVS (Transient Voltage Suppressor, an overvoltage suppressor, a TVS diode) having a clamping voltage of 500 V smaller than the withstanding voltage (for example, 550 V) of the switches S2 and S4. With this configuration, as described in detail below, when the switches S2 and S4 are turned off, it is prevented that a voltage exceeding the withstanding voltage is applied between the terminals of the switches S2 and S4. As a result, the insulation detecting device of the fourth embodiment achieves an effect such that an optical MOSFET having a withstanding voltage (for example, the same withstanding voltage as those of the switches S1 and S3) lower than the output voltage of the voltage boosting circuit 4 can be used.

Further, the protection elements P1 and P2 are not limited to the TVS, and a zener diode or a varistor may be employed. However, in a case where the protection elements P1 and P2 are formed using the TVS (or the zener diode), an overvoltage absorbing protection element is formed by connecting two TVSs (or zener diodes) in series in a reverse direction. With this configuration, even in a case where a direction of the voltage applied to each of the switches S2 and S4 (that is, a direction of flowing current) becomes the direction of the voltage applied in the forward direction of one TVS, the direction of the voltage applied to the other TVS becomes the reverse direction, so that the voltage applied to the switches S2 and S4 can be kept under a breakdown voltage of the TVS (or the zener diode) while preventing the current from flowing through the protection element. Further, the reason why two TVSs (or the zener diodes) are connected in series in the reverse direction to form the protection elements P1 and P2 is that the TVS (or the zener diode) has an asymmetrical characteristic between a forward characteristic and a reverse characteristic. Therefore, in a case where an element having a clamping voltage characteristic (corresponding to a breakdown voltage characteristic of the TVS) of a forward or reverse target represented as a varistor or the like is used as the protection elements P1 and P2, a pair of protection elements P1 and P2 can be formed by one element.

Hereinafter, a protection effect of the switches S2 and S4 by the protection elements P1 and P2 will be described based on FIGS. 12 and 1. However, the description will be made about a case where the output voltage (a voltage on the primary side) of the direct-current power supply BAT is 200 V, the clamping voltage of the protection elements P1 and P2 is 500 V, and the withstanding voltage of the switches S2 and S4 is 550 V, but the present embodiment is not limited thereto.

For example, in a case where the output voltage of the voltage boosting circuit 4 is 600 V, when the ground fault occurs to make the ground fault resistance RLp2 become 0 (zero) Ω, the voltage at point A in the drawing is 600 V which is the output voltage of the voltage boosting circuit 4. In this case, the voltage at point A is applied to the resistor R4 through a virtual ground, and applied to the switch S4 on a side near the ground through the resistor R4. In addition, the voltage at point A is applied to the resistor R5 through the virtual ground, and also applied to the switch S3 on a side near the ground through the resistor R5. In other words, at the time of the V0 measurement in which the switches S3 and S4 are each turned off, and 600 V which is the output voltage of the voltage boosting circuit 4 is applied to the switches S3 and S4 in the OFF state on a side near the ground. However, at the time of charging the capacitor C1 in the Vc1p measurement in which the switch S4 is turned on and the switch S2 is turned off, the voltage at point A is applied to the switch S2 through the virtual ground, the resistor R4, the switch S4, and the resistor R2.

At this time, as can be seen from FIG. 1, the switch S3 is disposed on one end (the upper terminal in FIG. 1) of the capacitor C1 (that is, on the positive electrode side of the direct-current power supply BAT). Therefore, even in a case where the ground fault occurs to make the ground fault resistance RLp2 become 0 (zero) Ω, the voltage applied to the switch S3 at the time of the OFF state (the voltage applied between the terminals of the switch S3 at the time of the OFF state) is reduced from 600 V which is the output voltage of the voltage boosting circuit 4 by 200 V which is the output voltage of the direct-current power supply BAT so as to be 400 V. Further, in a case where the switch S3 is turned on and the switch S1 is turned off, the voltage applied between the terminals of the switch S1 also becomes the same voltage (400 V). Therefore, when an optical MOSFET having a withstanding voltage equal to or larger than 400 V (600 V−200 V=400 V) is used, the protection element is not necessary for the switches S1 and S3.

On the other hand, the switch S4 is disposed on a side near the other end (the lower terminal of FIG. 1) of the capacitor C1 (that is, on the negative electrode side of the direct-current power supply BAT). Therefore, in a case where the ground fault occurs to make the ground fault resistance RLp2 become 0 (zero) Ω, when the switch S2 is turned on and the switch S4 is turned off like a case of the V0 measurement, the voltage applied between the terminals of the switch S4 at the time of the OFF state becomes 600 V which is the output voltage of the voltage boosting circuit 4. Therefore, the optical MOSFET having a withstanding voltage of 600 V or more (in practice, a withstanding voltage of about 700 V or more in consideration of a margin) is necessarily used in the switch S4. Similarly, the optical MOSFET having a withstanding voltage of 600 V or more (in practice, a withstanding voltage of about 700 V or more in consideration of a margin) is necessarily used even in the switch S2. In other words, it is necessary that the optical MOSFET having a withstanding voltage higher than those of the switches S1 and S3 disposed in the one end (the upper terminal in FIG. 1) of the capacitor C1 (that is, on the positive electrode side of the direct-current power supply BAT) is used.

However, there are few types of the optical MOSFETs having a high withstanding voltage of 700 V or more, the size thereof is also large, and furthermore the cost is expensive, so that it is desirable that the same optical MOSFETs as the switches S1 and S3 be used.

Therefore, in the insulation detecting device of the fourth embodiment, the protection elements P1 and P2 having a clamping voltage lower than the withstanding voltage of the switches S2 and S4 are connected in parallel with the switches S2 and S4. With this configuration, the voltage applied to the switches S2 and S4 at the time of the OFF state is set to be a clamping voltage smaller (lower) than the withstanding voltage of each of the switches S2 and S4, and even in a case where the switch S2 is turned on and the switch S4 is turned off like at the time of the V0 measurement, the voltage applied between the terminals of the switch S4 can be clamped under the withstanding voltage. As a result, it is possible to reduce the casing of the insulation detecting device of the fourth embodiment and to manufacture the insulation detecting device at a lower cost.

Figure 13:
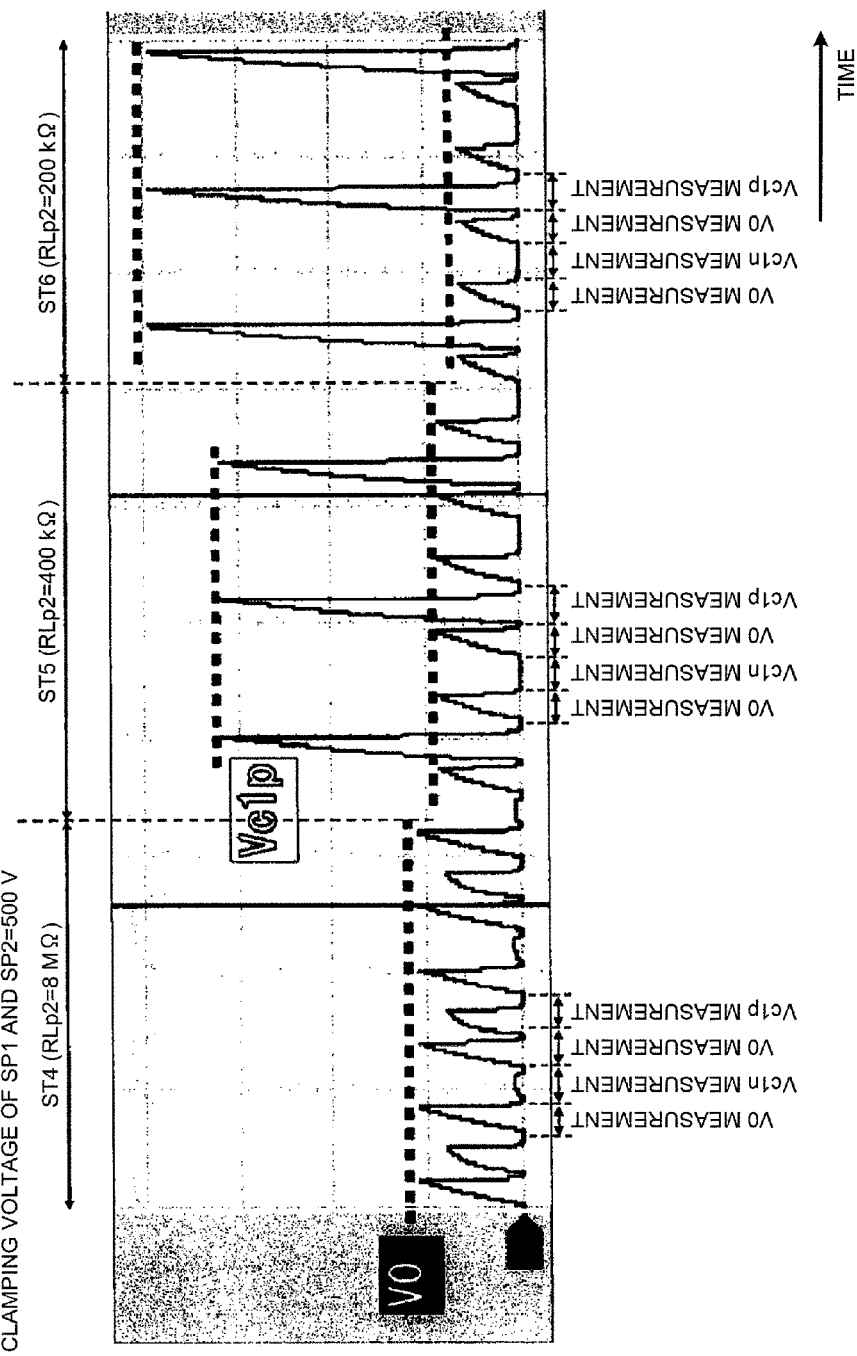
FIG. 13 is a diagram illustrating a simulation result of measurement voltage-time characteristics at the time of the V0 measurement, the Vc1p measurement, and the Vc1n measurement in a case where a ground fault resistance RLp2 of the positive electrode on the secondary side is reduced when the secondary voltage of the voltage boosting circuit is high.
Figure 14:
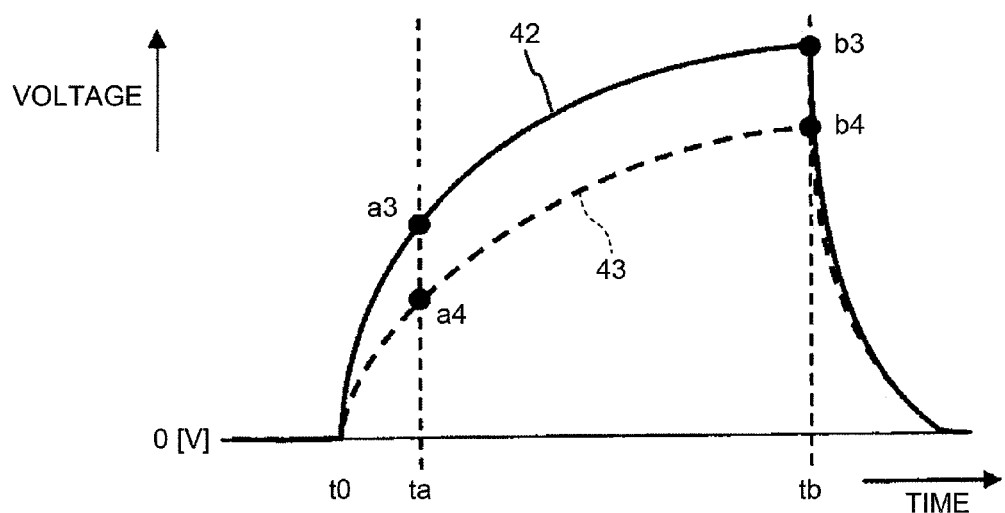
FIG. 14 is a diagram for describing a change in measurement voltage in the Vc1p measurement in a case where the ground fault resistance RLp2 of the positive electrode on the secondary side is reduced when the secondary voltage of the voltage boosting circuit is high.

Next, FIG. 13 is a diagram illustrating a simulation result of measurement voltage-time characteristics at the time of the V0 measurement, the Vc1$p$ measurement, and the Vc1$n$ measurement in a case where a ground fault resistance RLp2 of the positive electrode on the secondary side is reduced when the secondary voltage of the voltage boosting circuit is high, FIG. 14 is a diagram for describing a change in measurement voltage in the Vc1$p$ measurement in a case where the ground fault resistance RLp2 of the positive electrode on the secondary side is reduced when the secondary voltage of the voltage boosting circuit is high, and FIG. 15 is a diagram illustrating an example of table data for correcting a measurement value in the V0 measurement in the insulation detecting device of the fourth embodiment of the present invention. Hereinafter, the correction of the V0 measurement in a case where the ground fault resistance RLp2 is reduced in the insulation detecting device of the fourth embodiment will be described based on FIGS. 12 to 15. Further, the output voltage of the voltage boosting circuit 4 and the ground fault resistances RLp2 and RLn2 used in a simulation are different, but FIG. 13 is a diagram corresponding to FIG. 6. In addition, FIG. 14 is a diagram corresponding to FIG. 8.

As illustrated in a period ST4 of FIG. 13, even in a case where the output voltage of the voltage boosting circuit 4 is a voltage exceeding 500 V (750 V in FIG. 13) which is the clamping voltage of the protection elements P1 and P2, when the ground fault resistances RLp2 and RLn2 are not reduced, similarly to the first embodiment described above, a waveform (the measurement voltage) corresponding to 200 V which is the output voltage of the direct-current power supply BAT is obtained even in the V0 measurement. However, as illustrated in periods ST5 and ST6, in a case where the ground fault resistance RLp2 is significantly reduced, even when the output voltage of the voltage boosting circuit 4 or the direct-current power supply BAT is not changed, the waveform in the V0 measurement (that is, the measurement voltage obtained in the V0 measurement) is reduced according to the reduction of the ground fault resistance RLp2.

In the configuration in which the protection elements P1 and P2 are connected to the switches S2 and S4 in parallel, the reduction of the measurement voltage obtained in the V0 measurement is caused when the voltage at point A by the reduction of the ground fault resistance RLp2 exceeds the clamping voltage of the protection elements P1 and P2 (in particular, the protection element P2). For example, in a case where the ground fault occurs to make the ground fault resistance RLp2 become 0 (zero) Ω, even when the switch S4 is turned off like at the time of the V0 measurement, the reduction is caused when the voltage 100 V (600 V−500 V=100 V) is applied to the other end of the capacitor C1 through the protection element P2 and the branch wiring 10 disposed in the switch S4. In other words, in the V0 measurement, the switches S1 and S2 are turned on, the switches S3 and S4 are turned off, the switches S1 and S2 are turned off after the capacitor C1 is charged, and the switches S3 and S4 are turned on so as to charge the capacitor C1 by the direct-current power supply BAT.

In this case, the measurement voltage in the V0 measurement (that is, the voltage to charge the capacitor C1) becomes a voltage smaller than the output voltage of an actual direct-current power supply BAT, so that the output voltage of the direct-current power supply BAT calculated in the V0 measurement is also smaller than the output voltage of the actual direct-current power supply BAT. In other words, in a case where the voltage at point A exceeds the clamping voltage of the protection element P2 disposed in the switch S4 according to the reduction of the ground fault resistance RLp2, a phenomenon that the output voltage of the direct-current power supply BAT measured in the V0 measurement is deviated from the output voltage of the actual direct-current power supply BAT is caused when the voltage exceeding the clamping voltage (an exceeding voltage) is applied to the other end (on the negative electrode side) of the capacitor C1, so that the correction is extremely important in a case where the output voltage of the direct-current power supply BAT obtained in the V0 measurement is necessary even at the time of the reduction of the ground fault resistance RLp2.

For example, the output voltage of the direct-current power supply BAT measured by the insulation detecting device may be used as a cell controller for backup to measure and monitor the output voltage of the direct-current power supply BAT. In this case, the output voltage of the direct-current power supply BAT measured by the cell controller becomes different from the output voltage of the direct-current power supply BAT measured by the insulation detecting device, and as a result a problem occurs. Therefore, it is necessary that the output voltage of the direct-current power supply BAT obtained in the V0 measurement is corrected. Further, the case where the output voltage of the direct-current power supply BAT obtained in the V0 measurement is necessarily corrected is restricted to a case where the ground fault resistance RLp2 is significantly reduced compared to the ground fault resistance RLn2, and as a result, the voltage (the voltage applied to the switch S4 through the ground and the resistor R4) at point A becomes equal to or more than the clamping voltage of the protection element P2.

Hereinafter, a method of correcting a deviation (a detection error) in the output voltage of the direct-current power supply BAT in the V0 measurement according to the reduction of the ground fault resistance RLp2 will be described in detail based on FIG. 14. However, FIG. 14 illustrates a change in the measurement voltage in the Vc1$p$ measurement when the output voltage from the voltage boosting circuit 4 is changed, in a case where the ground fault resistance RLp2 is the same (a case where Vtb3/Vta3 and Vtb4/Vta4 are equal). In particular, a voltage waveform 42 shows the charging characteristic of the capacitor C1 at the time of the Vc1$n$ measurement in a case where the output voltage from the voltage boosting circuit 4 is 600 V in the configuration illustrated in FIG. 12. Further, a voltage waveform 43 shows the charging characteristic of the capacitor C1 at the time of the Vc1$n$ measurement in a case where the output voltage from the voltage boosting circuit 4 is 400 V.

As described above, the occurrence of the detection error of the output voltage of the direct-current power supply BAT by the V0 measurement is caused when the potential (that is, the potential of the branch wiring 10) on the negative electrode side of the direct-current power supply BAT generated when the positive electrode and the negative electrode of the direct-current power supply BAT are connected to the capacitor C1 through the switches S1 and S2 to charge the capacitor C1 is pushed up by an amount of the exceeding voltage and a difference of the voltage applied to both ends of the capacitor C1 is reduced. Therefore, the detection error of the output voltage of the direct-current power supply BAT detected in the V0 measurement can be corrected as long as the exceeding voltage can be calculated. In other words, an error of the detection voltage of the direct-current power supply BAT detected in the V0 measurement can be corrected as long as a voltage (a B-C voltage or a B-C voltage difference) between point B and point C in FIG. 12 and the clamping voltage characteristic of the protection element P2 can be ascertained. Herein, since the clamping voltage characteristic of the protection element P2 can be ascertained in advance, the error of the detection voltage of the direct-current power supply BAT detected in the V0 measurement can be corrected by detecting the B-C voltage at the time of the reduction of the ground fault resistance RLp2.

In addition, in the insulation detecting device of the fourth embodiment, in a case where the voltage at point A is higher than the positive electrode voltage of the direct-current power supply BAT, the ground fault resistance is calculated from the measurement voltage in the Vc1$p$ measurement without using the value obtained in the V0 measurement. In other words, in a case where the output voltage of the voltage boosting circuit 4 becomes larger and the B-C voltage becomes equal to or more than the output voltage (for example, 200 V) of the direct-current power supply BAT, the measurement value obtained in the V0 measurement is not used regardless of the reduction of the ground fault resistances RLp2 and RLn2.

As can be seen from FIG. 14, even in a case where Vtb3/Vta3 and Vtb4/Vta4 become equal to each other in the Vc1$p$ measurement and the ground fault resistance RLp2 is the same, when the output voltage of the voltage boosting circuit 4 becomes larger, the charged voltage of the capacitor C1 at each of the time points to and tb becomes larger. Therefore, in the insulation detecting device of the fourth embodiment, as illustrated in FIG. 15, the table data of the B-C voltage corresponding to Vtb ((b) table 2 in FIG. 15) is created for each Vtb/Vta of the table data of the ground fault resistance corresponding to Vtb/Vta ((a) table 1 in FIG. 15), and the table data is referred to based on Vtb and Vtb/Vta obtained in the Vc1$p$ measurement to calculate (estimate) the B-C voltage.

Herein, as described above, in a case where the voltage (the voltage at point A) applied to point C through the virtual ground line (that is, the B-C voltage) is equal to or less than the clamping voltage of each of the protection elements P1 and P2, the potential at point A does not affect the V0 measurement. Therefore, in a case where the voltage calculated (estimated) based on Vtb and Vtb/Vta obtained in the Vc1$p$ measurement is equal to or less than the clamping voltage of each of the protection elements P1 and P2, it is determined that there is no detection error (normal value) in the output voltage of the direct-current power supply BAT detected based on the measurement voltage obtained in the V0 measurement and the output voltage of the direct-current power supply BAT, and the detected output voltage of the direct-current power supply BAT is output to the higher control device and the like.

On the other hand, in a case where the voltage calculated based on Vtb and Vtb/Vta obtained in the Vc1$p$ measurement is equal to or more than the clamping voltage of the protection element P2, it is determined that the output voltage of the direct-current power supply BAT detected based on the measurement voltage obtained in the V0 measurement is an output voltage which contains an error of the measurement voltage by an amount of a voltage exceeding the clamping voltage (the exceeding voltage) of the protection element P2. Therefore, the output voltage calculated based on the calculated (estimated) B-C voltage and the clamping voltage characteristic of the protection element P2 is output to the higher control device and the like as the output voltage of the direct-current power supply BAT.

Further, the calculating unit 18 is provided with the functions of calculating the B-C voltage by Vtb and Vtb/Vta obtained in the Vc1$p$ measurement described above, comparing and determining the B-C voltage and the clamping voltage of the protection element P2, and calculating the output voltage of the direct-current power supply BAT by referring to the table data based on the determination result. In addition, as a method of calculating the output voltage of the direct-current power supply BAT based on the calculated (estimated) B-C voltage and the clamping voltage characteristic of the protection element P2, for example, there is a method of adding a value obtained by multiplying a voltage (obtained by subtracting the clamping voltage (the exceeding voltage) of the protection element P2 from the B-C voltage) by the voltage dividing ratio of the resistors R3 and R4 to a measurement value obtained in the V0 measurement. With this calculating method, the table data for the V0 measurement can be used as it is, so that a storage area for the table data can be effectively saved. However, a relation between the measurement value obtained in the V0 measurement and the output voltage of the direct-current power supply BAT in consideration of the calculated (estimated) B-C voltage and a protection voltage characteristic of the protection element P2 is stored in the table data in advance, and the output voltage of the direct-current power supply BAT may be calculated by referring to the table data based on the measurement value obtained in the V0 measurement.

As described above, in the insulation detecting device of the fourth embodiment, the protection elements P1 and P2 corresponding to the withstanding voltage of the switches S2 and S4 are each disposed in the switches S2 and S4. Therefore, in addition to the effect of the insulation detecting device of the first embodiment described above, in a case where the reduction of the ground fault resistance RLp2 occurs when the output voltage of the voltage boosting circuit 4 is high, it is possible to effectively prevent that a voltage equal to or more than the withstanding voltage is applied to the switches S2 and S4 so that the switches S2 and S4 can be protected from being broken.

In addition, at this time, a part of the output voltage of the voltage boosting circuit 4 is applied to the negative electrode side of the capacitor C1 through the protection element P2 disposed in the switch S4 in the V0 measurement in which the switch S4 is turned off, but the B-C voltage is calculated based on the voltages Vtb and Vta obtained in the Vc1p measurement, and the output voltage obtained in the V0 measurement is corrected by the B-C voltage. Therefore, even in a case where the ground fault resistance RLp2 is reduced when the voltage is boosted in the configuration in which the protection elements P1 and P2 are disposed in the switches S2 and S4, it is possible to detect the accurate output voltage of the direct-current power supply BAT.

Further, in the insulation detecting device of the fourth embodiment, the protection elements P1 and P2 are connected only to the switches S2 and S4 in parallel, but the present invention is not limited thereto. For example, according to the output voltage of the voltage boosting circuit 4 and the voltage applied to point C when the ground fault occurs, the protection elements may also be connected to the switches S1 and S3.

In addition, in the insulation detecting device of the fourth embodiment, the description has been made about a case where the present invention is applied to the insulation detecting device of the first embodiment, but the present invention may be applied to the insulation detecting devices of the second and third embodiments. Even in this case, it is possible to obtain the same effect as the insulation detecting device of the fourth embodiment in addition to the effects of the insulation detecting devices of the second and third embodiments.

As described above, according to one aspect of the present invention, a control means monitors a measurement voltage of a flying capacitor charged through a second path, in a case where the measurement voltage is about 0 V (zero volt), controls a switching of switches, controls a charging of the flying capacitor through a third path and a measuring of a charged voltage of the flying capacitor charged through the third path, and measures a first measurement voltage in a first time after the switching to the third path and a second measurement voltage in a second time different from the first time. Next, a calculating means calculates a ground fault resistance formed between a direct-current power supply and a ground based on the first measurement voltage and the second measurement voltage. Since the control means and the calculating means can be configured by a program which is executed by a microcomputer, it is possible to provide an insulation detecting device which can measure the ground fault resistance between the direct-current power supply and the secondary side of the voltage boosting circuit, and the ground using a simply configuration not requiring an additional circuit.

In addition, according to another aspect of the present invention, in a case where an output voltage on a secondary side is boosted by a boosting operation of a voltage boosting circuit and a ground potential becomes higher than a potential on a positive electrode side of the direct-current power supply, the control means controls a switching of switches, controls a charging of the flying capacitor through the third path and a measuring of the charged voltage of the flying capacitor charged through the third path, and measures a first measurement voltage in a first time after the switching to the third path and a second measurement voltage in a second time different from the first time. Next, the calculating means calculates the ground fault resistance formed between the direct-current power supply and the ground based on the first measurement voltage and the second measurement voltage. Since the control means and the calculating means can be configured by a program which is executed by a microcomputer, it is possible to provide an insulation detecting device which can measure the ground fault resistance between the direct-current power supply and the secondary side of the voltage boosting circuit, and the ground using a simply configuration not requiring an additional circuit.

In addition, according to still another aspect of the present invention, a flying capacitor is connected between a positive electrode of the direct-current power supply and the ground to charge the flying capacitor, the positive electrode of the direct-current power supply is disconnected from the flying capacitor after the charging, a measurement circuit is connected to the flying capacitor, a voltage charged in the flying capacitor is measured, the measured voltage is monitored, the flying capacitor is connected between the ground and the negative electrode of the direct-current power supply to charge the flying capacitor in a case where the measured voltage is about 0 V (zero volt), measure a first measurement voltage in a first time after the connection of the flying capacitor and a second measurement voltage in a second time different from the first time, and a ground fault resistance formed between the direct-current power supply and the ground is calculated based on the first measurement voltage and the second measurement voltage. Therefore, it is possible to realize an insulation detecting method by a program which is executed by the microcomputer, and the ground fault resistance between the direct-current power supply and the secondary side of the voltage boosting circuit, and the ground can be measured by a simple configuration not requiring an additional circuit.

Furthermore, the measurement voltage of the flying capacitor charged through the second path is monitored, and the detection in a case where the measurement voltage is about 0 V (zero volt), and the detection in a case where the ground potential becomes higher than the potential on the positive electrode side of the direct-current power supply due to an increase of the output voltage on the secondary side according to the boosting operation of the voltage boosting circuit can be configured by a program which is executed by the microcomputer. Therefore, the monitoring and the detection can be achieved using a simple configuration not requiring an additional circuit.

According to still another aspect of the present invention, a second switch disposed between the other end of the flying capacitor and the negative electrode of the direct-current power supply and a fourth switch disposed between the other end of the flying capacitor and the ground each include a protection element which is connected in parallel, and the protection element maintains a voltage applied between the second switch and the fourth switch to be equal to or lower than a predetermined voltage. Therefore, in a case where the ground fault resistance on the positive electrode side is reduced, it is possible to prevent that a voltage equal to or more than the withstanding voltage is applied to the second and fourth switches, and the second and fourth switches can be protected from being broken.

According to still another aspect of the present invention, a voltage applied between the negative electrode side of the direct-current power supply of the second switch and the ground side of the fourth switch in a first path is estimated based on the first and second measurement voltages and a characteristic of the protection element connected in parallel with the fourth switch, and an output voltage of the direct-current power supply calculated from the measurement voltage of the flying capacitor charged through the first path is corrected based on the estimated voltage and a characteristic of the protection element connected in parallel with the fourth switch. Therefore, in a case where the ground fault resistance is reduced and a voltage equal to or higher than the clamping voltage of the protection element is applied between the negative electrode side of the direct-current power supply of the second switch and the ground side of the fourth switch, it is possible to detect an accurate output voltage of the direct-current power supply from the measurement voltage of a capacitor measured in the first path.

Although the present invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An insulation detecting device which includes a flying capacitor configured to retain a charged voltage and a measurement circuit configured to measure the charged voltage of the flying capacitor, is connected to a direct-current power supply electrically insulated from a ground, and measures a ground fault resistance formed between the direct-current power supply and the ground based on the charged voltage of the flying capacitor which is measured by the measurement circuit, the insulation detecting device comprising:
   a plurality of switches configured to switch a first path from a positive electrode of the direct-current power supply to an negative electrode of the direct-current power supply through the flying capacitor, a second path from the positive electrode of the direct-current power supply to the ground through the flying capacitor, a third path from the ground to the negative electrode of the direct-current power supply through the flying capacitor, and a fourth path which releases a connection between the flying capacitor and the direct-current power supply and connects the flying capacitor and the measurement circuit;
   a control unit configured to monitor a measurement voltage of the flying capacitor charged through the second path, and in a case where the measurement voltage is about 0 V (zero volt), control a switching of the switches, control a charging of the flying capacitor through the third path and a measuring of the charged voltage of the flying capacitor charged through the third path, and measure a first measurement voltage in a first time after the switching to the third path and a second measurement voltage in a second time different from the first time; and
   a calculating unit configured to calculate the ground fault resistance formed between the direct-current power supply and the ground based on the first measurement voltage and the second measurement voltage.

2. The insulation detecting device according to claim 1, wherein
   the plurality of switches includes a first switch which is disposed between one end of the flying capacitor and the positive electrode of the direct-current power supply, a second switch which is disposed between the other end of the flying capacitor and the negative electrode of the direct-current power supply, a third switch which is disposed between one end of the flying capacitor and the ground, and a fourth switch which is disposed between the other end of the flying capacitor and the ground, and
   the second switch and the fourth switch are connected to each other in parallel, and each of the second switch and the fourth switch includes a protection element configured to maintain a voltage applied to the second switch and the fourth switch to be equal to or lower than a withstanding voltage thereof.

3. The insulation detecting device according to claim 2, wherein
   the control unit includes
   an estimating unit configured to estimate a voltage applied between the negative electrode side of the direct-current power supply of the second switch and the ground side of the fourth switch in the first path, based on the first and second measurement voltages and a characteristic of the protection element connected in parallel with at least the fourth switch, and
   a correcting unit configured to correct an output voltage of the direct-current power supply calculated from a measurement voltage of the flying capacitor charged through the first path, based on a voltage applied between the negative electrode side of the direct-current power supply of the second switch and the ground side of the fourth switch and a characteristic of the protection element connected in parallel with the fourth switch.

4. An insulation detecting device which includes a flying capacitor configured to retain a charged voltage and a measurement circuit configured to measure the charged voltage of the flying capacitor, is connected to a direct-current power supply electrically insulated from a ground and to a voltage boosting circuit on a side of the direct-current power supply, and measure a ground fault resistance formed between the direct-current power supply and a secondary side of the voltage boosting circuit, and the ground, the voltage boosting circuit being configured to boost an output voltage of the direct-current power supply and electrically insulated from the ground, the insulation detecting device comprising:
   a plurality of switches configured to switch a first path from a positive electrode of the direct-current power supply to an negative electrode of the direct-current power supply through the flying capacitor, a second path from the positive electrode of the direct-current power supply to the ground through the flying capacitor, a third path from the ground to the negative electrode of the direct-current power supply through the flying capacitor, and a fourth path which releases a connection between the flying capacitor and the direct-current power supply and connects the flying capacitor and the measurement circuit;

a control unit configured to, in a case where an output voltage on the secondary side is boosted by a boosting operation of the voltage boosting circuit and the ground potential becomes higher than a potential on the positive electrode side of the direct-current power supply, control a switching of the switches, control a charging of the flying capacitor through the third path and a measuring of the charged voltage of the flying capacitor charged through the third path, and measure a first measurement voltage in a first time after the switching to the third path and a second measurement voltage in a second time different from the first time; and a calculating unit configured to calculate the ground fault resistance formed between the direct-current power supply and the secondary side of the voltage boosting circuit, and the ground based on the first measurement voltage and the second measurement voltage.

5. The insulation detecting device according to claim 4, wherein the plurality of switches includes a first switch which is disposed between one end of the flying capacitor and the positive electrode of the direct-current power supply, a second switch which is disposed between the other end of the flying capacitor and the negative electrode of the direct-current power supply, a third switch which is disposed between one end of the flying capacitor and the ground, and a fourth switch which is disposed between the other end of the flying capacitor and the ground, and the second switch and the fourth switch are connected to each other in parallel, and each of the second switch and the fourth switch includes a protection element configured to maintain a voltage applied to the second switch and the fourth switch to be equal to or lower than a withstanding voltage thereof.

6. The insulation detecting device according to claim 5, wherein the control unit includes an estimating unit configured to estimate a voltage applied between the negative electrode side of the direct-current power supply of the second switch and the ground side of the fourth switch in the first path, based on the first and second measurement voltages and a characteristic of the protection element connected in parallel with at least the fourth switch, and a correcting unit configured to correct an output voltage of the direct-current power supply calculated from a measurement voltage of the flying capacitor charged through the first path, based on a voltage applied between the negative electrode side of the direct-current power supply of the second switch and the ground side of the fourth switch and a characteristic of the protection element connected in parallel with the fourth switch.

7. An insulation detecting method of measuring a ground fault resistance which is formed between a direct-current power supply electrically insulated from a ground and the ground, the insulation detecting method comprising the steps of:

connecting a flying capacitor between a positive electrode of the direct-current power supply and the ground to charge the flying capacitor;

connecting a measurement circuit to the flying capacitor after the positive electrode of the direct-current power supply is disconnected from the flying capacitor, and measuring a voltage charged in the flying capacitor;

monitoring the measured voltage, and in a case where the measured voltage is about 0 V (zero volt), charging the flying capacitor by connecting the flying capacitor between the ground and an negative electrode of the direct-current power supply, and measuring a first measurement voltage in a first time after the connection of the flying capacitor and a second measurement voltage in a second time different from the first time; and calculating the ground fault resistance formed between the direct-current power supply and the ground based on the first measurement voltage and the second measurement voltage.

* * * * *